US012047051B2

(12) United States Patent
Vigilante et al.

(10) Patent No.: US 12,047,051 B2
(45) Date of Patent: Jul. 23, 2024

(54) MATCHING NETWORK WITH TUNABLE NOTCH FILTER

(71) Applicant: QUALCOMM INCORPORATED, San Diego, CA (US)

(72) Inventors: Marco Vigilante, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 474 days.

(21) Appl. No.: 17/367,667

(22) Filed: Jul. 6, 2021

(65) Prior Publication Data

US 2022/0021365 A1 Jan. 20, 2022

Related U.S. Application Data

(60) Provisional application No. 63/052,884, filed on Jul. 16, 2020.

(51) Int. Cl.
*H03H 7/06* (2006.01)
*H01Q 1/50* (2006.01)
*H03H 7/09* (2006.01)
*H03H 7/38* (2006.01)
*H03H 7/01* (2006.01)

(52) U.S. Cl.
CPC ............... *H03H 7/06* (2013.01); *H01Q 1/50* (2013.01); *H03H 7/09* (2013.01); *H03H 7/38* (2013.01); *H03H 2007/013* (2013.01)

(58) Field of Classification Search
CPC .......... H03H 7/38; H03H 7/0115; H03H 7/09; H03H 7/06
USPC .......... 333/124, 125, 177, 175, 172, 32, 176
See application file for complete search history.

(56) References Cited

U.S. PATENT DOCUMENTS

| 5,731,841 A | 3/1998 | Rosenbaum et al. |
| 2012/0098620 A1 | 4/2012 | Tseng |
| 2015/0035612 A1 | 2/2015 | Maxim et al. |
| 2017/0149327 A1* | 5/2017 | Klimovitch ............. H02M 1/44 |

FOREIGN PATENT DOCUMENTS

| EP | 0584732 A1 | 3/1994 |
| WO | 2017160282 A1 | 9/2017 |

OTHER PUBLICATIONS

International Search Report and Written Opinion—PCT/US2021/040598—ISA/EPO—Oct. 27, 2010.

* cited by examiner

*Primary Examiner* — Rakesh B Patel
(74) *Attorney, Agent, or Firm* — Smith Tempel Blaha LLC/Qualcomm Incorporated

(57) ABSTRACT

A filter circuit includes a matching network having resistive and capacitive elements, and a transformer in the matching network. The transformer includes a primary side and a secondary side, and has at least one interwinding capacitance coupled from an input on the primary side to a non-inverting output on the secondary side.

21 Claims, 26 Drawing Sheets

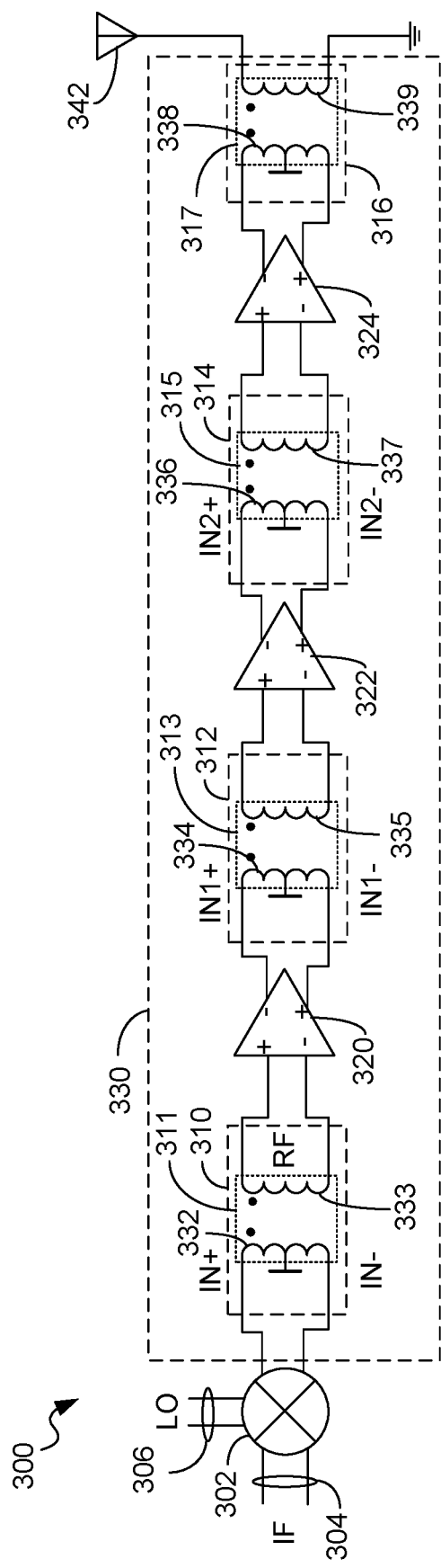
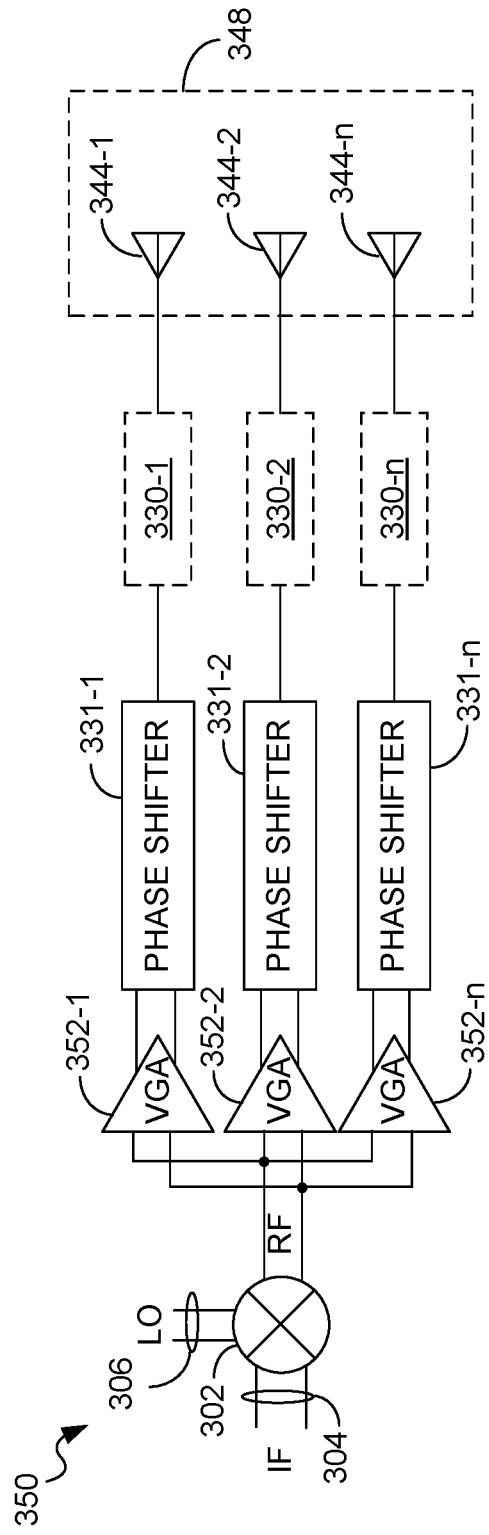
FIG. 3A
FIG. 3B

Non-Inverting transformer

MATCHING NETWORK WITH TUNABLE NOTCH FILTER

RELATED APPLICATIONS

This application claims priority to and the benefit of U.S. Provisional Patent Application No. 63/052,884, entitled "MATCHING NETWORK WITH TUNABLE NOTCH FILTER," filed Jul. 16, 2020, the contents of which are hereby incorporated herein by reference in their entirety as if fully set forth below and for all applicable purposes.

FIELD

The present disclosure relates generally to electronics, and more specifically to radio frequency (RF) transmitters and receivers.

BACKGROUND

Wireless communication devices and technologies are becoming ever more prevalent, as are communication devices that operate at millimeter-wave (mmW) frequencies. Wireless communication devices generally transmit and/or receive communication signals.

A transmitter in a mmW communication system generally uses one or more amplifier stages and one or more mixers to upconvert a signal for transmission. For example, in the upconversion path, an intermediate frequency (IF) signal may be upconverted by a mixer to a radio frequency (RF) signal for transmission and in the downconversion path, a radio frequency (RF) signal may be downconverted by a mixer to an intermediate frequency (IF) signal for reception. Signal upconversion and downconversion may result in spurious tones at the mixer output. These spurious tones (sometimes called spurs) may occur at the local oscillator (LO) frequency, and at harmonic frequencies of the LO signal, such as two times the LO (2LO) frequency, and may have signal energy that may appear sufficiently close to a communication signal in a communication signal band to detrimentally affect the communication signal.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a filter circuit including a matching network having resistive and capacitive elements, and a transformer in the matching network, the transformer having a primary side and a secondary side, the transformer having at least one interwinding capacitance coupled from an input on the primary side to a non-inverting output on the secondary side.

Another aspect of the disclosure provides a method for creating a notch filter response using a matching network with a tunable notch filter including conveying a signal through a transformer having an interwinding capacitance across an input of a primary side of a transformer and a non-inverting output of a secondary side of the transformer, and adjusting a value of the interwinding capacitance to determine a notch filter response.

Another aspect of the disclosure provides a device including means for conveying a signal through a transformer having an interwinding capacitance across an input of a primary side of a transformer and a non-inverting output of a secondary side of the transformer, and means for adjusting a value of the interwinding capacitance to determine a notch filter response.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 3A is a block diagram of at least a portion of an exemplary transmit chain in which exemplary embodiments of the matching network with a tunable notch filter may be implemented.

FIG. 3B is a block diagram of at least a portion of an exemplary transmit chain in which exemplary embodiments of the matching network with a tunable notch filter may be implemented.

DETAILED DESCRIPTION

Figure 1:
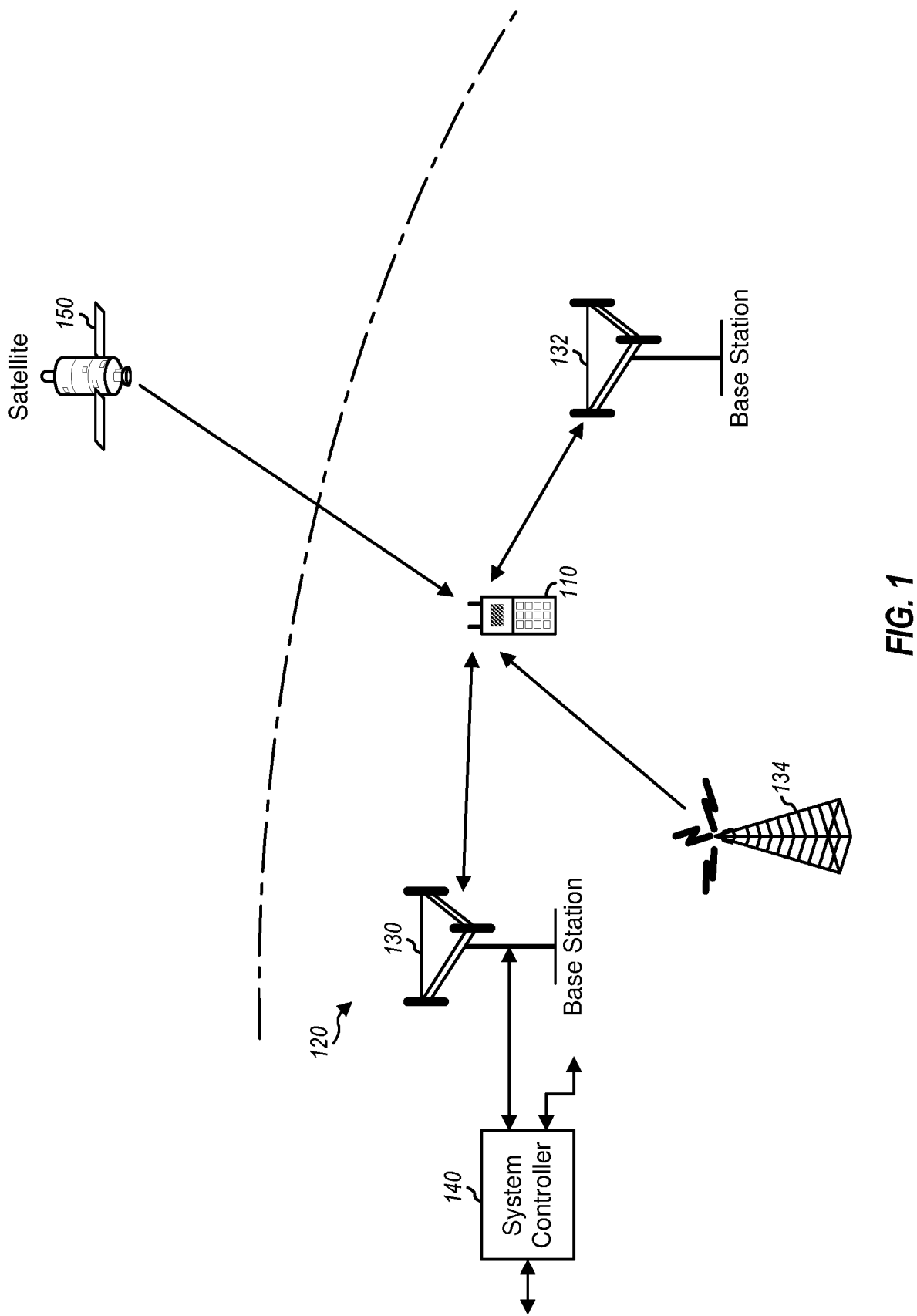
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

A modern wireless communication device that operates at millimeter-wave (mmW) frequencies on multiple communication bands must meet a number of radio frequency (RF) energy emission standards. Requirements for emissions at the local oscillator (LO) and 2LO frequencies in a mmW 5G communication system are stringent, typically on the order of −36 dBc for user equipment (UE) and on the order of −46 dBc for customer premises equipment (CPE).

Some mmW communication system and devices use a type of transmit and receive architecture referred to as heterodyne, or super-heterodyne. A super-heterodyne architecture uses an intermediate frequency, that is, a transmit signal is upconverted first from a baseband signal to an intermediate frequency (IF) using a local oscillator (LO) signal at an intermediate frequency, and is then upconverted from the IF to radio frequency (RF) for transmission. Similarly, a receive signal is downconverted first from an RF signal to an IF signal, and then downconverted from the IF to a baseband signal for information recovery.

The IF and LO mixer frequencies are chosen such that the spurious tones fall outside the frequency range of the mmW signal path. Example bands for a mmW communication system may include the 24 GHz to 30 GHz band, the 37 GHz-43.5 GHz band (which may encompass a 37 GHz to 40 GHz band and a 39 GHz to 43.5 GHz band) and the 48 GHz band, which may span 47.2 GHz to 48.2 GHz. For example, in order to minimize LO frequency tuning range and also to prevent a very high IF frequency, the 48 GHz communication band may use an LO frequency of 34 GHz which is located outside of the 37 GHz-43.5 GHz band. Similarly, the LO frequency for the 37 GHz-43.5 GHz band may be 26 GHz, resulting in a 2LO of 52 GHz that falls close to the 48 GHz band.

One way to minimize the detrimental effect of spurious emissions from the LO on a communication signal is to design narrow band amplifier stages. However, narrow band amplifier stages dictate the use of separate paths for each sub-band resulting in a large chip area.

Exemplary embodiments of a matching network with a tunable notch filter response, which may be implemented as a compact low-loss matching network with a tunable notch filter, disclosed herein can be used to reject spurious (LO) signal energy that may appear close to a communication band of interest.

Exemplary embodiments of a matching network with a tunable notch filter response may be implemented in a transceiver, in either or both of the transmit chain or the receive chain.

Exemplary embodiments of a matching network with a tunable notch filter response may be implemented in multiple locations in either or both of the transmit chain or the receive chain.

Exemplary embodiments of a matching network with a tunable notch filter response may be implemented in a single-ended signal architecture, or in a differential signal architecture.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150 in one or more global navigation satellite systems (GNSS)), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
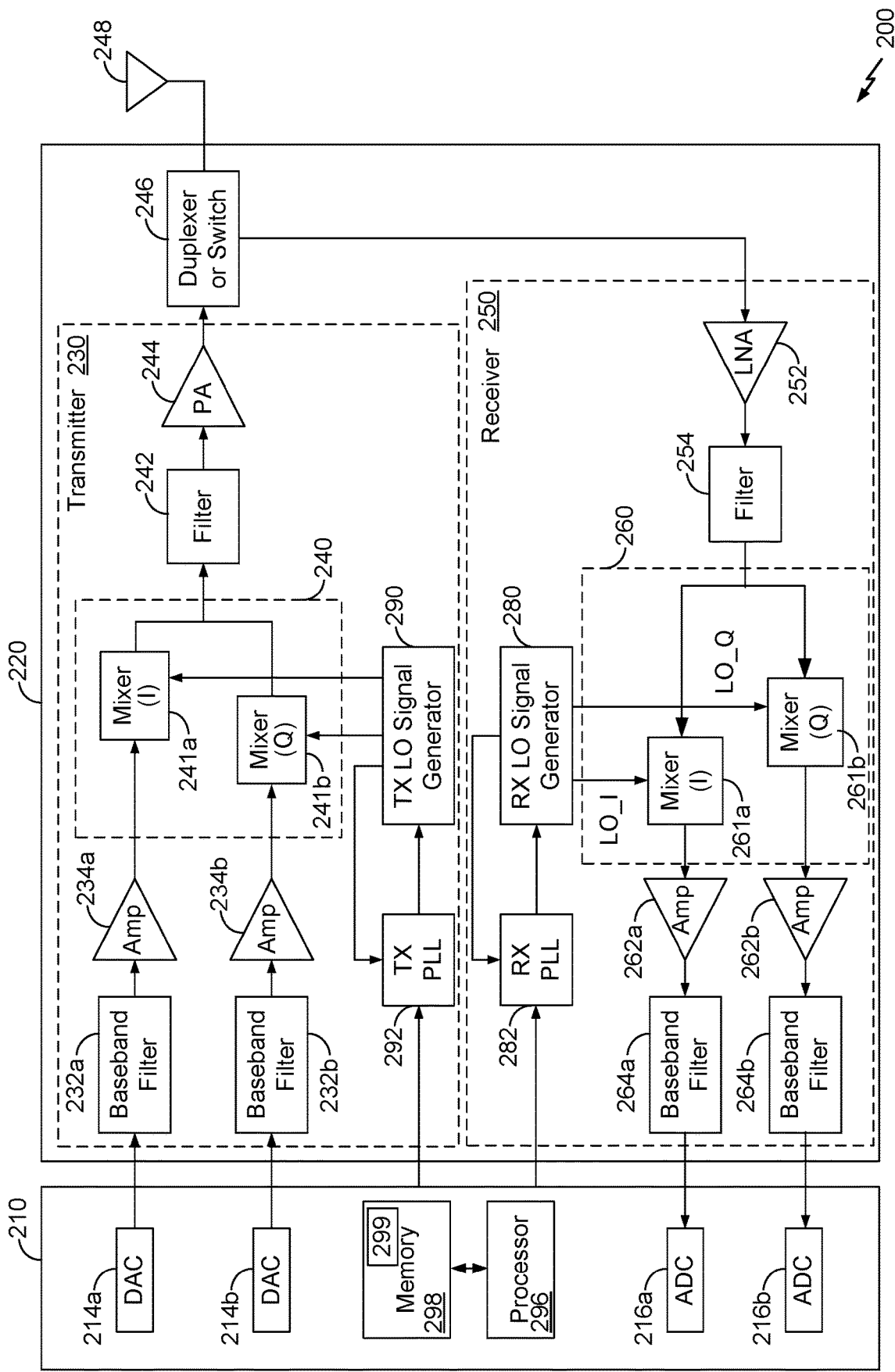
FIG. 2A is a block diagram showing a wireless device in which the exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes, as exemplary software 299, and may generally comprise analog and/or digital processing elements. The processor 296 and the memory 298 may cooperate to control, configure, program, or otherwise fully or partially control some or all of the operation of the embodiments of the matching network with a tunable notch filter described herein.

The transceiver 220 includes a transmitter 230 and a receiver 250 that support bi-directional communication. In general, wireless device 200 may include any number of transmitters and/or receivers for any number of communication systems and frequency bands. In some embodiments, only a transmitter or only a receiver may be implemented. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals (e.g., using mixers 241a, 241b) with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Down-conversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

Exemplary embodiments of the matching network with a tunable notch filter described herein may be implemented in one or more locations within the power amplifier 244 and/or the filter 242. Exemplary embodiments of the matching network with a tunable notch filter described herein may also be implemented in or as part of the filter 254 and/or the LNA 252 in the receiver 250, or in other locations or components within the transceiver 220.

In an exemplary embodiment in a super-heterodyne architecture, the filter 242, PA 244, LNA 252 and filter 254 may be implemented separately from other components in the transmitter 230 and receiver 250, for example on a millimeter wave integrated circuit. An example super-heterodyne architecture is illustrated in FIG. 2B.

Figure 2B:
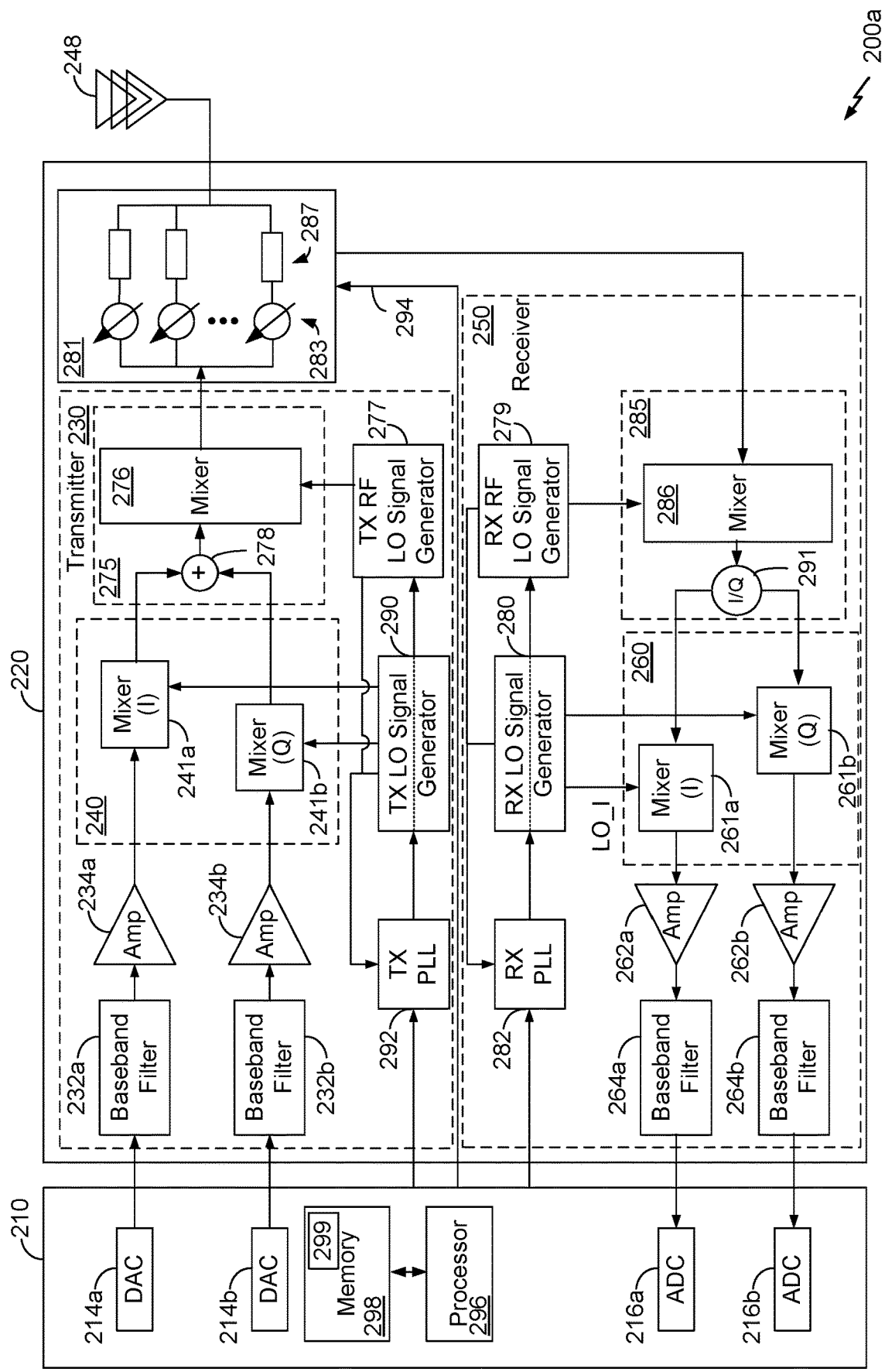
FIG. 2B is a block diagram showing a wireless device in which the exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, matching networks, amplifiers, driver amplifiers, and power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 10 GHz using the architecture illustrated in FIG. 2A and to communicate with signals having a frequency above about 10 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 10 GHz (e.g., having a mmW frequency) may be transmitted and/or received using a direct conversion architecture. In such embodiments, for example, a phased array may be implemented in the direct conversion architecture.

Figure 2C:
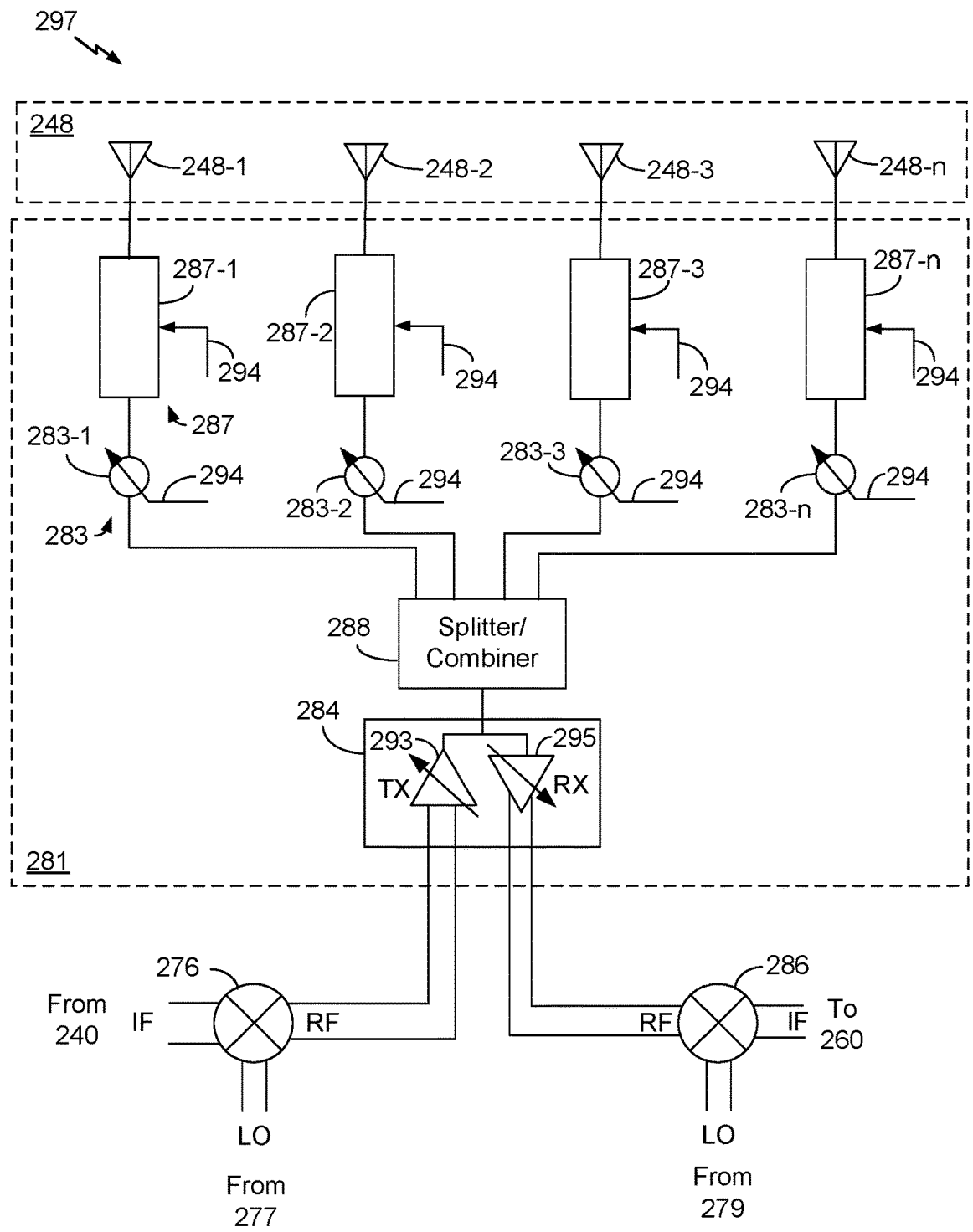
FIG. 2C is a block diagram showing in greater detail an embodiment of some of the components of FIG. 2B.

FIG. 2C is a block diagram 297 showing in greater detail an embodiment of some of the components of FIG. 2B. In an exemplary embodiment, the upconversion mixer 276 provides an RF transmit signal to the phase shift circuitry 281 and the downconversion mixer 286 receives an RF receive signal from the phase shift circuitry 281. In an exemplary embodiment, the phase shift circuitry 281 comprises an RF variable gain amplifier 284, a splitter/combiner 288, the phase shifters 283 and the phased array elements 287. In an exemplary embodiment, the phase shift circuitry 281 may be implemented on a millimeter-wave integrated circuit (mmWIC). In some such embodiments, the upconverter 275 and/or the downconverter 285 (or just the mixers 276, 286) are also implemented on the mmWIC. In an exemplary embodiment, the RF VGA 284 may comprise a TX VGA 293 and an RX VGA 295. In some embodiments, the TX VGA 293 and the RX VGA 295 may be implemented independently. In other embodiments, the VGA 284 is bidirectional. In an exemplary embodiment, the splitter/combiner 288 may be an example of a power distribution network and a power combining network. In some embodiments, the splitter/combiner 288 may be implemented as a single component or as a separate signal splitter and signal combiner. The phase shifters 283 are coupled to respective phased array elements 287. In the exemplary embodiment shown in FIG. 2C, the phase shifters 283 and the phased array elements 287 are configured to process both transmit and receive signals; however, in other embodiments separate phase shifters 283 and/or phased array elements 287 may be configured to separately process transmit and receive signals. Each respective phased array element 287 is coupled to a respective antenna element in the antenna array 248. In an exemplary embodiment, phase shifters 283 and the phased array elements 287 receive control signals from the data processor 210 over connection 294. The exemplary embodiment shown in FIG. 2C comprises a 1×4 array having four phase shifters 283-1, 283-2, 283-3 and 283-n, four phased array elements 287-1, 287-2, 287-3 and 287-n, and four antennas 248-1, 248-2, 248-3 and 248-n. However, a 1×4 phased array is shown for example only, and other configurations, such as 1×2, 1×6, 1×8, 2×3, 2×4, or other configurations are possible.

FIG. 3A is a block diagram of at least a portion of an exemplary transmit chain 300 in which exemplary embodiments of the matching network with a tunable notch filter may be implemented. Aspects of the tunable notch filter are omitted from the illustration in FIG. 3A for simplicity, but will be described below with respect to subsequent figures. In an exemplary embodiment, the transmit chain 300 may be implemented in a mmW communication device that implements a super-heterodyne (superhet) architecture in which a communication signal that is to be transmitted may be converted from a baseband information signal, to an intermediate frequency signal, and then upconverted from the intermediate frequency to a radio frequency signal. Similarly, a received communication signal may be downconverted from an RF signal, to an IF signal, and then further downconverted from the IF signal to a baseband information signal. Those of skill in the art, however, will understand that embodiments of the matching network with a tunable notch filter may instead or additionally be implemented in a direct conversion architecture. In some embodiments, an LO for communications in the 20 s or 30 s of GHz is implemented, and 2LO may be near or overlap frequencies of communication signals in the 50 s or 60 s of GHz. Thus, while the description below includes a superhet architecture (and refers to IF communication signals), those of skill in the art will understand that embodiments are not limited thereto (and that direct conversion and baseband communication signals may additionally or alternatively be implemented, for example). The exemplary transmit chain 300 is shown for illustrative purposes only and may comprise a portion of a transmit chain in an mmW communication device.

In an exemplary embodiment, the transmit chain 300 may comprise a mixer 302 configured to receive an intermediate frequency (IF) communication signal over differential connections 304, and a local oscillator (LO) signal over differential connections 306. In an exemplary embodiment, the mixer 302 may be an embodiment of the mixer 276 of FIG. 2B.

In an exemplary embodiment, the transmit chain 300 may comprise one or more power amplifier stages, with three exemplary power amplifier stages 320, 322 and 324 shown in FIG. 3A for example only. The three amplifier stages 320, 322 and 324 may be configured to provide the same or different levels of signal amplification. In an exemplary embodiment, the first amplifier stage 320 and the second amplifier stage 322 may be referred to as driver stages, and the third amplifier stage 324 may be referred to as a power amplifier. More or fewer amplifier stages may be included in a transmit chain, depending on application.

In an exemplary embodiment, the transmit chain 300 may comprise one or more matching networks 310, 312, 314 and 316. The matching networks 310, 312, 314 and 316 may be configured to pass an RF signal from one component to another component, such as from the mixer 302 to the amplifier stage 320, from amplifier stage to amplifier stage, and from amplifier stage to a load, such as an antenna, a phase shifter, etc. The matching networks 310, 312, 314 and 316 may each comprise one or more passive and/or active components, such as transistors, resistances, capacitances, inductances (not shown in FIG. 3A), and a respective transformer 311, 313, 315 and 317. For example, the transformer 311 may comprise a primary side 332 and a secondary side 333. Similarly, the transformer 313 may comprise a primary side 334 and a secondary side 335; the transformer 315 may comprise a primary side 336 and a secondary side 337; and the transformer 317 may comprise a primary side 338 and a secondary side 339.

In an exemplary embodiment, each transformer 311, 313, 315 and 317 may be configured in what is referred to as a "negative magnetic coupling" or as a "positive magnetic coupling." Using what is referred to as a dot convention to show the coupling, if a current "enters" the dotted terminal of a coil, the reference polarity of the voltage induced in the other coil is positive at its dotted terminal. If a current "leaves" the dotted terminal of a coil, the reference polarity of the voltage induced in the other coil is negative at its dotted terminal. In a transformer, a mutual inductance, $L_M$, is created between the inductance, L1, of the primary side and the inductance, L2, of the secondary side. The coupling strength of the transformer is related to the ratio of the mutual inductance to self-inductance: Lm/sqrt(L1*L2). If L1=L2=L, then k=$L_m$/L. This ratio is a measure of the coupling strength, and is known as the coupling factor or coupling coefficient, $k_M$, or k, for a pair of synchronously tuned shunt inductive coupled resonators.

Although shown in FIG. 3A as being coupled in a configuration that results in a positive magnetic coupling, one or more of the transformers 311, 313, 315 and 317 may be coupled in a configuration that results in a negative magnetic coupling.

Although shown in FIG. 3A as being a differential architecture, the transmit chain 300 may also be configured in a single-ended architecture.

In an exemplary embodiment, the output of the amplifier stage 324 is shown as being connected through the matching network 316 to an antenna 342. However, in other embodiments, the output of the power amplifier 324 may be coupled to other elements, such as to a phase shifter, to another amplifier, etc. Similarly, while the input of the amplifier stage 320 is shown as being connected through the matching network 310 to the mixer 302, one or more components (such as a phase shifter) may be coupled therebetween. Further, while three amplifier stages and four matching networks are illustrated in FIG. 3A, embodiments may include a greater or fewer number of amplifier stages and matching networks.

In an exemplary embodiment, the matching networks 310, 312, 314 and 316; and the amplifier stages 320, 322 and 324 may comprise a transmit path 330, where one or more transmit paths 330 may be implemented in a phased array architecture. The transmit path 330 may include a fewer or greater number of amplifier stages and/or a fewer or greater number of matching networks in other embodiments. The transmit path 330 may be included within one of the phased array elements 287.

FIG. 3B is a block diagram of at least a portion of an exemplary transmit chain 350 in which exemplary embodiments of the matching network with a tunable notch filter may be implemented. The transmit chain 350 is an example of a phased array antenna architecture in which multiple transmit paths 330-1, 330-2 through 330-n may be coupled to the mixer 302. In an exemplary embodiment, the number of transmit paths 330 is dependent upon implementation, with three transmit paths 330-1, 330-2 and 330-n shown for simplicity of illustration.

In an exemplary embodiment, an input of each transmit path 330 is coupled to a respective phase shifter 331, where transmit path 330-1 is coupled to a phase shifter 331-1, transmit path 330-2 is coupled to a phase shifter 331-2 and transmit path 330-n is coupled to a phase shifter 331-n. In an exemplary embodiment, each phase shifter 331 is coupled to a respective variable gain amplifier 352, with the phase shifter 331-1 coupled to the VGA 352-1, the phase shifter 331-2 coupled to the VGA 352-2, and the phase shifter 331-n coupled to the VGA 352-n. The VGAs 352 receive the RF signal from the mixer 302. In such embodiments, an output of each of the transmit paths 330 is coupled to a respective antenna element 344 in an array 348 of antenna elements. For example, transmit path 330-1 is coupled to antenna element 344-1, transmit path 330-2 is coupled to antenna element 344-2 and transmit path 330-n is coupled to antenna element 344-n. In other embodiments, instead of all of the transmit paths 330 being coupled to the mixer 302, each transmit path 330 is coupled to a respective mixer, for example such that a phase shift may be introduced by modulating a LO signal provided to each respective mixer as opposed to the phase shift being provided in the signal path as illustrated in FIG. 3B.

Figure 3C:
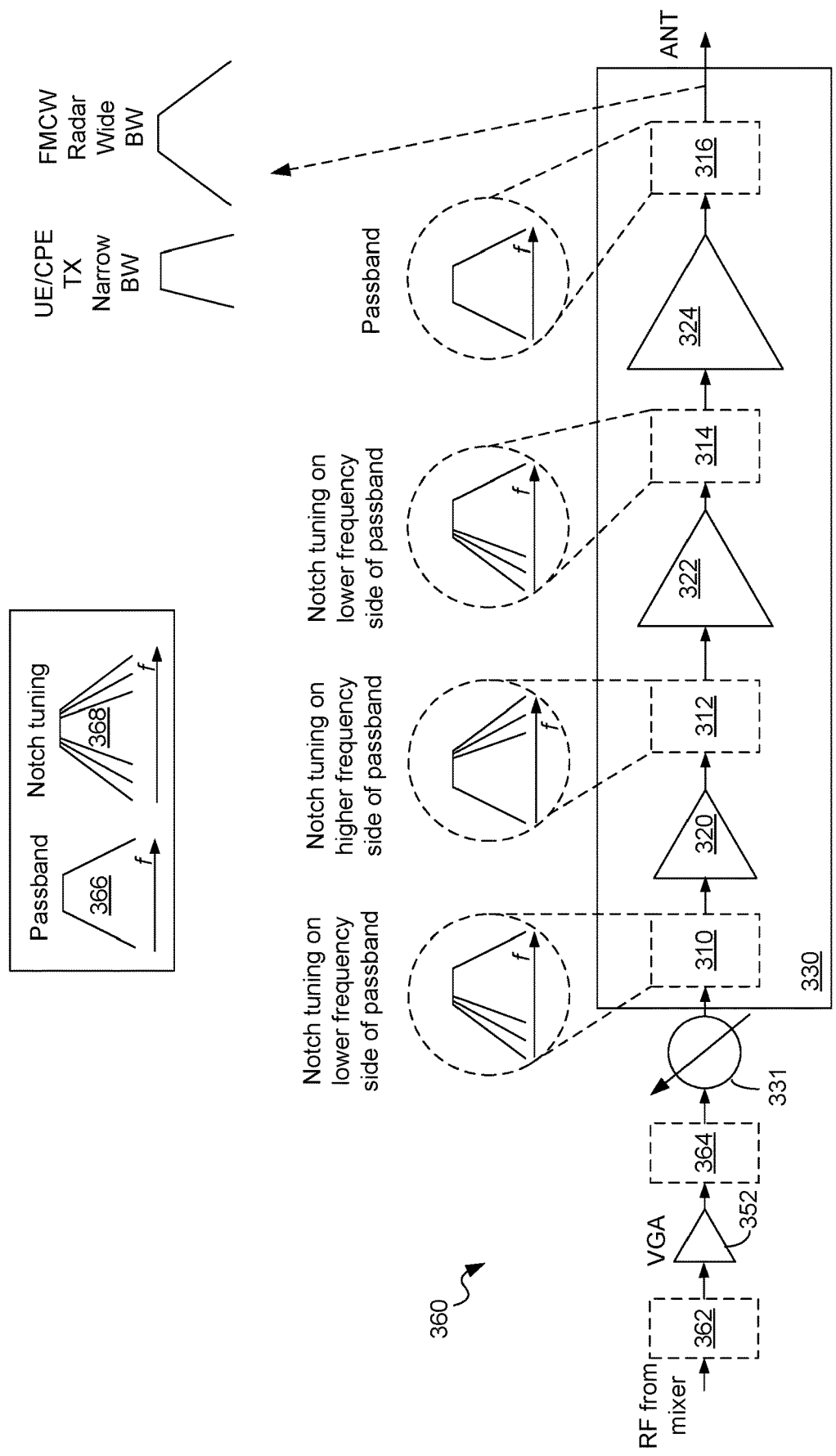
FIG. 3C is a block diagram of at least a portion of an exemplary transmit chain in which exemplary embodiments of the matching network with a tunable notch filter may be implemented.

FIG. 3C is a block diagram 360 of at least a portion of an exemplary transmit path in which exemplary embodiments of the matching network with a tunable notch filter may be implemented. An exemplary transmit path 330 is coupled to a phase shifter 331. An RF signal is provided to the VGA 352 through an optional matching network 362. The output of the VGA 352 may also be provided to a matching network 364, the output of which may be coupled to the phase shifter 331. In an exemplary embodiment, the matching networks 362 and 364 may be similar to the matching networks 310, 312, 314 and 316 described above.

In an exemplary embodiment, one or more of the matching networks 362, 364, 310, 312, 314 and 316 may be configured to provide a range of filter responses that may include a notch tuning response. Exemplary embodiments of the matching network with a tunable notch filter described herein may be configured to provide a selectable notch filter response on a lower frequency side of a passband 366 and/or on a higher frequency side of the passband 366. In some embodiments, the matching networks 362, 364, 310, 312, 314 and 316 may be configured to provide a wideband response, or a passband response.

In an exemplary embodiment, configuring one or more of the matching networks 362, 364, 310, 312, 314 and 316 to provide a tunable notch response may allow the transmit path 330 to transmit a low bandwidth signal and a high bandwidth signal in alternating communication time periods, such as in different communication slots, frames, etc. For example, it may be desirable to have the ability to transmit a normal communication (sometimes referred to as mission mode) transmit (TX) signal, which may be a narrow bandwidth signal, using a narrow channel bandwidth, and also have the ability to transmit a different type of signal, such as, for example only, a frequency modulated continuous wave (FMCW) radar signal, which may be a wide bandwidth signal, using a wide channel bandwidth. An example of a FMCW signal may be a radar signal used to determine user proximity to a communication device. Further, configuring one or more of the matching networks 362, 364, 310, 312, 314 and 316 to provide a tunable notch response may allow a chip or IC implementing the transmit path to be used in a variety of devices having differing transmission requirements.

Figure 3D:
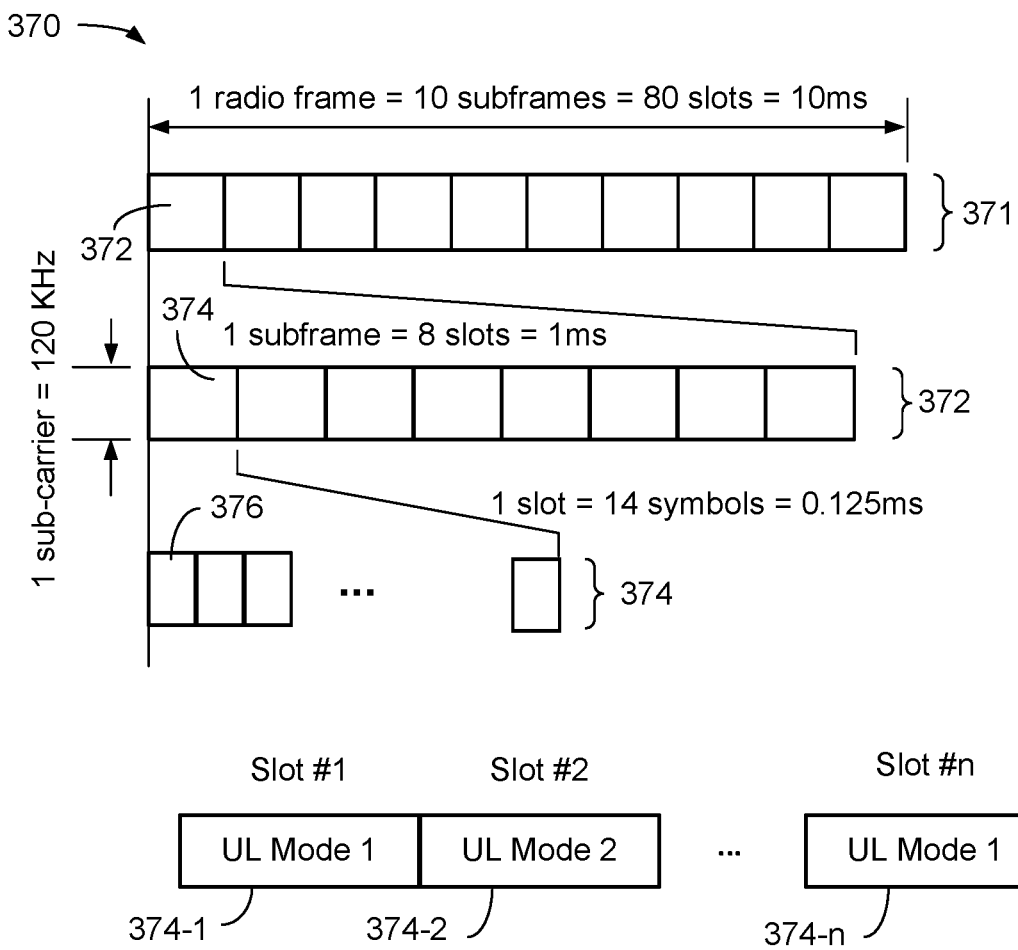
FIG. 3D is a diagram showing a communication frame structure with 120 KHz sub-carrier spacing.

FIG. 3D is a diagram showing a 5G communication frame structure 370 with 120 KHz sub-carrier spacing. The frame structure 370 shows a 120 KHz sub-carrier spacing (SCS)

and shows one (1) radio frame 371 having ten (10) subframes 372, which equates to 80 slots and a time duration of 10 milliseconds (ms). Each subframe 372 may comprise eight (8) slots 374 and have a duration of 1 ms. Each slot 374 may comprise 14 communication symbols 376 having a duration of 0.125 ms (125 µs), with each symbol having a duration of approximately 9 microseconds (µs). Other subcarrier spacing leads to other communication symbol lengths. In an exemplary embodiment, each slot 374 may be selectively configured for a different transmit channel bandwidth. For example, a first slot 374-1 may be configured in a first uplink mode (UL Mode 1) and a second slot 374-2 may be configured in a second uplink mode (UL Mode 2). In the 5G communication frame structure 370 with 120 KHz sub-carrier spacing there are eight (8) slots, but the number of slots in a subframe may differ based on sub-carrier spacing. In an exemplary embodiment, a first uplink mode, UL Mode 1, may be configured to transmit a normal communication signal in which case the communication slot 374-1 would be transmitted at a time when the transmit path 330 is configured for a narrow bandwidth signal to meet emission standards. In an exemplary embodiment, a second uplink mode, UL Mode 2, may be configured to transmit a FMCW signal, such as a radar signal, in which case the communication slot 374-2 would be transmitted at a time when the transmit path 330 is configured for a wide channel bandwidth. Although two uplink modes are shown in FIG. 3D for example purposes, other numbers of uplink modes are possible.

Referring again to FIG. 3C, in an exemplary embodiment, one or more of the matching networks 362, 364, 310, 312, 314 and 316 may be selectively configured to provide a transmit path 330 having a channel bandwidth that may accommodate signals of differing bandwidth requirements, such as a wide bandwidth and a narrow bandwidth, and/or signals at differing frequencies. In an exemplary embodiment, the selectivity of the transmit path bandwidth and/or frequency may be adjustable or variable on a slot-by-slot basis. One or more of the matching networks 362, 364, 310, 312, 314 and 316 may be selectively configured to provide a notch tuning response across a first set of frequencies such that channel response adjustability is enabled on one or the other side of a passband. For example, the notch tuning response of one of the matching networks 362, 364, 310, 312, 314 and 316 may be selectively configured to provide channel response adjustability on a lower frequency side of a passband, and the notch tuning response of another of the matching networks 362, 364, 310, 312, 314 and 316 may be selectively configured to provide channel response adjustability on a higher frequency side of a passband. In an exemplary embodiment, the matching network 310 in FIG. 3C may be configured to provide channel response adjustability on a lower frequency side of the passband 366 (where the angled lines on the left side of the passband represent different frequencies to which a notch response may be tuned) and the matching network 312 in FIG. 3C may be configured to provide channel response adjustability on a higher frequency side of the passband 366 (where the angled lines on the right side of the passband represent different frequencies to which a notch response may be tuned). In an exemplary embodiment, the range of adjustability of the response of the transmit path 330 may be illustrated using the channel response 368. By selectively adjusting one or more of the matching networks 362, 364, 310, 312, 314 and 316 a variety of channel responses for the transmit path 330 may be developed to allow transmission of a wide variety of signals having different bandwidth and/or frequency. Setting several matching networks to have the same notch frequency may deepen the notch at that frequency. Setting several matching networks to have slightly different notch frequencies may widen the range of frequencies which are rejected around the passband. It should be understood that in some embodiments (e.g., as described below) a notch response of one or more matching networks (e.g., any of the matching networks 362, 364, 310, 312, 314 and 316) may be disabled. Further, one or more of the matching networks 362, 364, 310, 312, 314 and 316 may be configured with a notch response that is not tunable or without a notch response.

Figure 4:
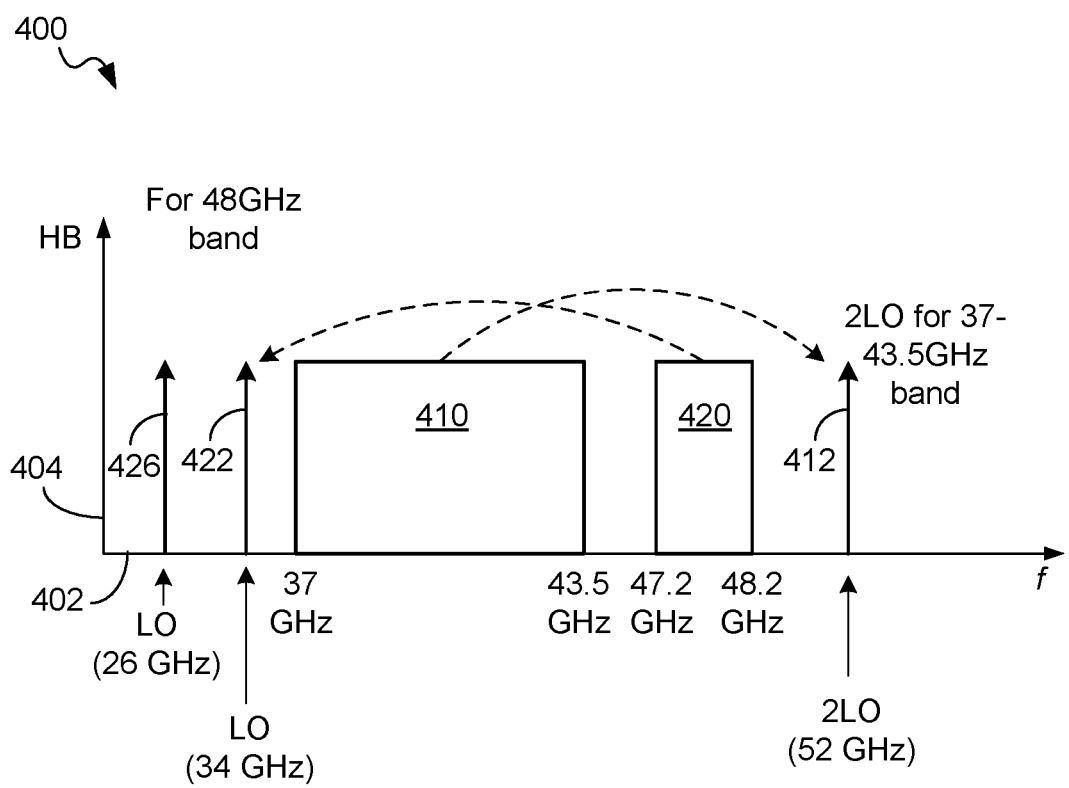
FIG. 4 shows a graph of a portion of a communication spectrum.

FIG. 4 shows a graph 400 of a portion of a communication spectrum. The graph 400 includes a horizontal axis 402 that shows frequency increasing to the right, and a vertical axis 404 showing signal energy increasing upwardly. In an exemplary embodiment, the vertical axis 404 is labeled "HB" corresponding to "high band" energy; however, the exemplary embodiments of a notch filter described herein may be implemented in other communication bands.

The graph 400 also shows a communication band 410 spanning approximately 37 GHz to approximately 43.5 GHz; and shows a communication band 420 spanning approximately 47.2 GHz to approximately 48.2 GHz. The communication band 410 will also be interchangeably referred to as the 37-43.5 GHz band and the communication band 420 will also by interchangeably referred to as the 48 GHz band.

In an exemplary embodiment, various frequency plans for a variety of communication bands may be implemented. An example of a local oscillator frequency for the 48 GHz communication band 420 may be located at approximately 34 GHz, and is shown using reference numeral 422. An example of a local oscillator frequency for the 37-43.5 GHz communication band 410 may be located at approximately 26 GHz, and is shown using reference numeral 426. However, a second harmonic of the 26 GHz may appear at 52 GHz, shown using reference numeral 412. In an exemplary embodiment, the 34 GHz LO signal 422 may contribute to interference with a communication signal in the 37-43.5 GHz communication band and/or the 52 GHz 2LO signal 412 may contribute to interference with a communication signal in the 48 GHz communication band. As will be described herein, exemplary embodiments of the matching network with a tunable notch filter may be used to create a notch filter response to minimize any detrimental impact of the 34 GHz LO signal 422 on the 37-43.5 GHz communication band 410, while not degrading the communication signal in the 48 GHz communication band 420; and may be used to create a notch filter response to minimize any detrimental impact of the 52 GHz 2LO signal 412 on the 48 GHz communication band 420, while not degrading a communication signal in the 37-43.5 GHz communication band 410. Exemplary embodiments of the matching network with a tunable notch filter may be configured to provide multiple notch filter responses over a range of frequencies.

Figure 5:
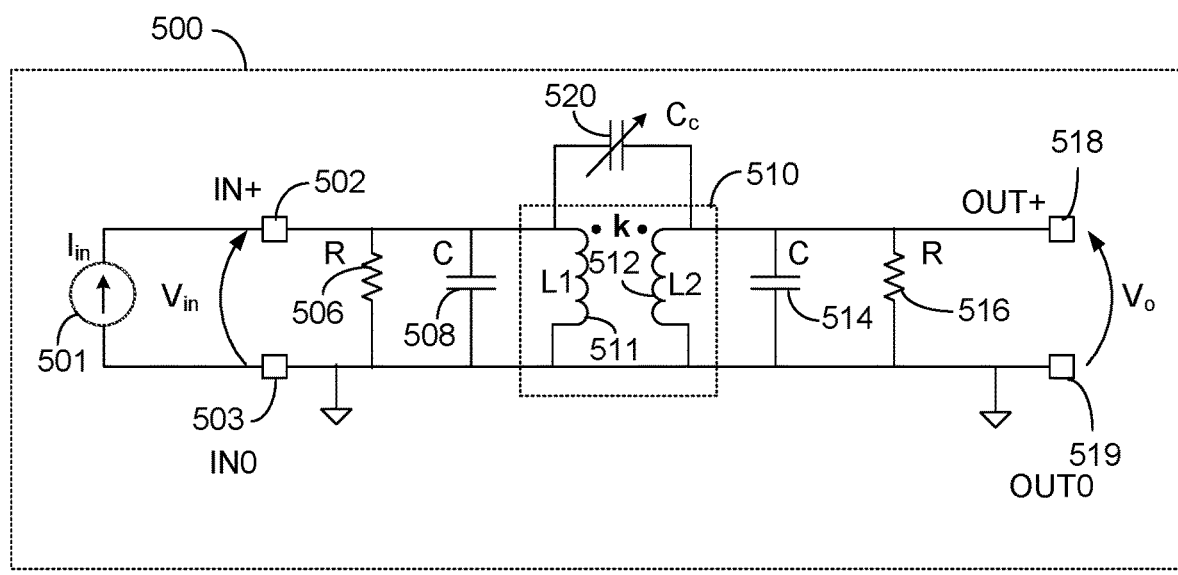
FIG. 5 is a diagram showing an exemplary embodiment of a matching network with a single-ended tunable notch filter.

FIG. 5 is a diagram showing an exemplary embodiment of a matching network with a single-ended tunable notch filter. The exemplary embodiment of the matching network with a tunable notch filter shown in FIG. 5 may also be referred to as a matching network 500. In an exemplary embodiment, the matching network 500 is a single-ended implementation, in which an input voltage signal, Vin, and an input current, Iin, represented by current source 501, is provided over node 502 and node 503. In the example shown in FIG. 5, the node 502 is provided with a positive voltage (IN+) and the node 503 is at system ground (0V). The node 502 may also be referred to as an input node. The matching network 500 also comprises a resistor 506, a capacitor 508, a transformer 510, a capacitor 514 and a resistor 516. An output of the matching network 500 is provided over nodes 518 and 519, where the node 518 provides a voltage (OUT+) and the node 519 is at system ground (0V). The node 518 may also be referred to as an output node, and may be considered the non-inverting output of the transformer 510.

In an exemplary embodiment, the transformer 510 comprises a primary side 511 and a secondary side 512. The primary side 511 and the secondary side 512 are represented by inductances having an inductance, L. In an exemplary embodiment, the resistor 506 may be referred to as an input resistor and the capacitor 508 may be referred to as an input capacitor. In an exemplary embodiment, the capacitor 514 may be referred to as an output capacitor and the resistor 516 may be referred to as an output resistor. While both the primary side 511 and the secondary side 512 are represented with the inductance L, the primary side 511 and the secondary side 512 may be sized and/or shaped differently, and/or may have different inductances. Similarly, while the input and output capacitors are represented with the capacitance C, the input and output capacitors may have different capacitances. Further, while the input and output resistors are represented with the resistance R, the input and output resistors may have different resistances.

In an exemplary embodiment, a capacitance 520 may be coupled across the transformer 510. In an exemplary embodiment, the transformer 510 is configured such that its coupling factor, k, is larger than 0. That is, the transformer 510 is considered to have a positive magnetic coupling. The capacitance 520 may be an explicit capacitor coupled across the transformer or selectively coupled across the transformer, may be a fixed value capacitor, or may be an adjustable capacitance as shown in FIG. 5. In the single-ended embodiment shown in FIG. 5, the end of the primary side 511 opposite the capacitance 520 is coupled to system ground and the end of the secondary side 512 opposite the capacitance 520 is coupled to system ground. These ends may further be connected together.

The adjustable capacitance 520 is also referred to as an interwinding capacitance because it is coupled between the primary side 511 and the secondary side 512 of the transformer 510. In an exemplary embodiment, the adjustable capacitance 520 ($C_C$), together with the inductance, L, of the transformer 510 and the capacitance, C, of the capacitors 508 and 514, creates a notch filter response between the input node 502 and the output node 518 without adding any additional inductance around the transformer 510. In other words, the adjustable capacitance 520 and the primary side 511 and the secondary side 512 of the transformer 510 may be used to create the notch filter response without any other inductance. The addition of the adjustable capacitance 520 across the transformer 510 allows the inductance of the primary side 511 and the inductance of the secondary side 512 to be comparable or smaller in value with regard to a transformer that does not include the adjustable capacitance 520 while achieving a comparable band-pass response and generating the notch filter response described herein.

In an exemplary embodiment, connecting the adjustable capacitance 520 across the transformer primary side 511 and secondary side 512, that is, between the input at node 502 and the non-inverting output at node 518 of the transformer (i.e., in_plus (IN+) is connected to out_plus (OUT+) and in_minus (IN0), for this single-ended example, is connected to out_minus (OUT0), for this single-ended example), allows a transmission zero to appear through the matching network 500. An ideal transmission zero is a frequency at which the transfer function of a linear two-port network has zero transmission when poles and zeroes are located ideally. The notch filter response is realized when no signal can flow from input to output. To achieve that, a zero in the transfer function is created. In implementation the effectiveness of the transmission zero will depend on the electrical characteristics (for example, the Q) of the circuit and the positions of the poles and zeroes and the matching network 500 may exhibit non-ideal zero transmission.

In an exemplary embodiment, coupling the adjustable capacitance 520 from the positive input of the primary side 511 to the non-inverting output of the secondary side 512 creates a notch filter response at the output node 518.

In an exemplary embodiment, coupling the adjustable capacitance 520 from the positive input of the primary side 511 to the non-inverting output of the secondary side 512 creates an ultra-compact transformer-based matching network with tunable notch filter and low insertion loss at mmW frequencies.

Figure 6:
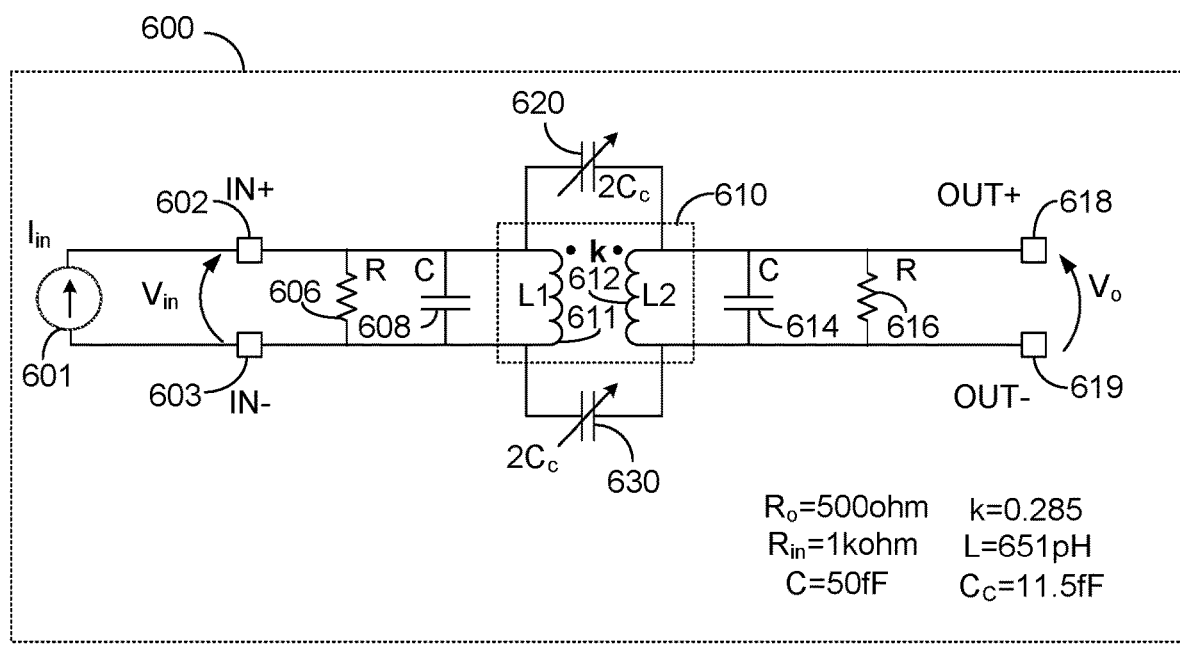
FIG. 6 is a diagram showing an exemplary embodiment of a matching network with a differential tunable notch filter.

FIG. 6 is a diagram showing an exemplary embodiment of a matching network with a differential tunable notch filter. The exemplary embodiment of the matching network with a tunable notch filter shown in FIG. 6 will also be referred to as a matching network 600. In an exemplary embodiment, the matching network 600 is a differential implementation, in which an input voltage signal, Vin, and an input current, Iin, represented by a current source 601, is provided over node 602 and node 603. In the example shown in FIG. 6, the node 602 is provided with a positive voltage (IN+) and the node 603 is provided with a negative voltage (IN−) of a differential input signal. The nodes 602 and 603 may also be referred to as the input nodes. The matching network also comprises a resistor 606, a capacitor 608, a transformer 610, a capacitor 614 and a resistor 616. An output of the matching network 600 is provided over nodes 618 and 619, where the node 618 provides a positive voltage (OUT+) and the node 619 provides a negative voltage (OUT−) of a differential output signal. The nodes 618 and 619 may also be referred to as the output nodes. The node 618 is also referred to as the non-inverting output of the transformer 610.

In an exemplary embodiment, the transformer 610 comprises a primary side 611 and a secondary side 612. The primary side 611 and the secondary side 612 are represented by inductances having an inductance, L. In an exemplary embodiment, the resistor 606 may be referred to as an input resistor and the capacitor 608 may be referred to as an input capacitor. In an exemplary embodiment, the capacitor 614 may be referred to as an output capacitor and the resistor 616 may be referred to as an output resistor.

In an exemplary embodiment, a capacitance 620 and a capacitance 630 may be coupled across the transformer 610. In an exemplary embodiment, the transformer 610 is configured such that its coupling factor, k, is larger than 0. That is, the transformer 610 is considered to have a positive magnetic coupling. The capacitance 620 and the capacitance 630 may be explicit capacitors coupled across the transformer or selectively coupled across the transformer, may be fixed value capacitors, or may be adjustable capacitances as shown in FIG. 6. The capacitances 620 and 630 may be interchangeably referred to as adjustable capacitances, interwinding capacitances, and/or interwinding adjustable capacitances.

The adjustable capacitance 620 and the adjustable capacitance 630 may be referred to as interwinding capacitances because they are coupled between the primary side 611 and the secondary side 612 of the transformer 610. In an exemplary embodiment, the adjustable capacitance 620 and the adjustable capacitance 630, together with the inductance, L, provided by the transformer 610 and the capacitance of the capacitors 608 and 614, create a notch filter response between the input nodes 602 and 603 and the output nodes 618 and 619 without adding any additional inductance around the transformer 610, as described above. In the differential application shown in FIG. 6, and elsewhere, the value of the adjustable capacitance 620 may be $2C_C$ and the value of the adjustable capacitance 630 may be $2C_C$ to realize the same frequency response as the single-ended example shown in FIG. 5.

In an exemplary embodiment, connecting the adjustable capacitance 620 across the transformer primary side 611 and secondary side 612, that is, between the input at node 602 and the non-inverting output at the node 618 of the transformer (i.e., in_plus (IN+) is connected to out_plus (OUT+)); and connecting the adjustable capacitance 630 across the transformer primary side 611 and secondary side 612, that is, between the input at node 603 and the inverting output at the node 619 of the transformer 610 (i.e., in_minus (IN−) is connected to out_minus (OUT−)) allows the transmission zero to appear through the matching network 600, as mentioned herein.

In an exemplary embodiment, coupling the adjustable capacitance 620 from the positive input of the primary side 611 to the non-inverting output of the secondary side 612; and coupling the adjustable capacitance 630 from the negative input of the primary side 611 to the inverting output of the secondary side 612 creates a notch filter response at the output nodes 618 and 619.

In an exemplary embodiment, coupling the adjustable capacitance 620 from the positive input of the primary side 611 to the non-inverting output of the secondary side 612; and coupling the adjustable capacitance 630 from the negative input of the primary side 611 to the inverting output of the secondary side 612 creates an ultra-compact transformer-based matching network with tunable notch filter and low insertion loss at mmW frequencies.

Figure 7:
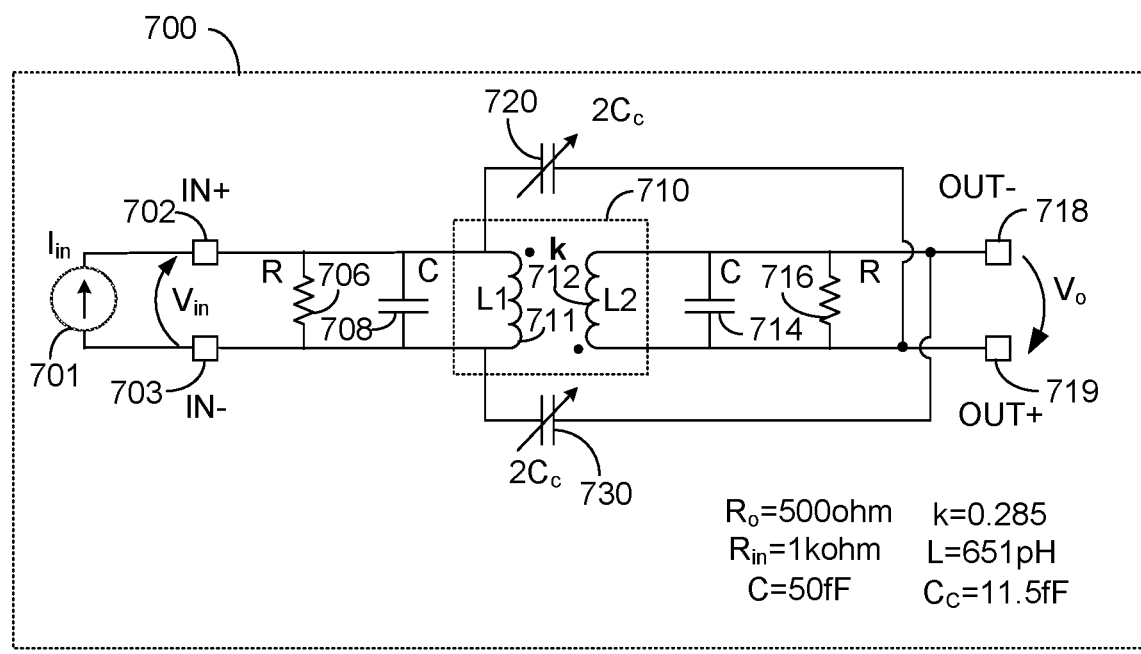
FIG. 7 is a diagram showing an exemplary embodiment of a matching network with a differential tunable notch filter.

FIG. 7 is a diagram showing an exemplary embodiment of a matching network with a differential tunable notch filter. The exemplary embodiment of the matching network with a tunable notch filter shown in FIG. 7 will also be referred to as a matching network 700. In an exemplary embodiment, the matching network 700 is a differential implementation, in which an input voltage signal, Vin, and an input current, Iin, represented by a current source 701, is provided over node 702 and node 703. In the example shown in FIG. 7, the node 702 is provided with a positive voltage (IN+) and the node 703 is provided with a negative voltage (IN−) of a differential input signal. The nodes 702 and 703 may also be referred to as the input nodes. The matching network also comprises a resistor 706, a capacitor 708, a transformer 710, a capacitor 714 and a resistor 716. An output of the matching network 700 is provided over nodes 718 and 719, where the node 718 provides a negative voltage (OUT−) and the node 719 provides a positive voltage (OUT+) of a differential output signal. The nodes 718 and 719 may also be referred to as the output nodes. Because the transformer 710 is an inverting transformer, the output polarities of the transformer 710 are reversed with respect to the output polarities of the transformer 610 of FIG. 6.

In an exemplary embodiment, the transformer 710 comprises a primary side 711 and a secondary side 712. The primary side 711 and the secondary side 712 are represented by inductances having an inductance, L. In an exemplary embodiment, the resistor 706 may be referred to as an input resistor and the capacitor 708 may be referred to as an input capacitor. In an exemplary embodiment, the capacitor 714 may be referred to as an output capacitor and the resistor 716 may be referred to as an output resistor.

In an exemplary embodiment, a capacitance 720 and a capacitance 730 may be coupled across the transformer 710. In an exemplary embodiment, the transformer 710 is configured such that its coupling factor, k, is less than 0 or close to 0. That is, the transformer 710 is considered to have a negative magnetic coupling. The capacitance 720 and the capacitance 730 may be explicit capacitors coupled across the transformer 710 or selectively coupled across the transformer 710, may be fixed value capacitors, or may be adjustable capacitances as shown in FIG. 7.

The adjustable capacitance 720 and the adjustable capacitance 730 are referred to as an interwinding capacitances because they are coupled between the primary side 711 and the secondary side 712 of the transformer 710. In an exemplary embodiment, the adjustable capacitance 720 and the adjustable capacitance 730, together with the inductance, L, of the transformer 710 and the capacitances 708 and 714, create a notch filter response between the input nodes 702 and 703 and the output nodes 718 and 719 without adding any additional inductance around the transformer 710, as described above.

In an exemplary embodiment, connecting the adjustable capacitance 720 across the transformer primary side 711 and secondary side 712, that is, between the input at node 702 and the non-inverting output at the node 719 of the transformer (i.e., in_plus (IN+) is connected to out_plus (OUT+); and connecting the adjustable capacitance 730 across the transformer primary side 711 and secondary side 712, that is, between the input at node 703 and the inverting output at the node 718 of the transformer 710 (i.e., in_minus (IN−) is connected to out_minus (OUT−) allows the transmission zero to appear through the matching network 700, as mentioned herein.

In an exemplary embodiment in which the transformer has a negative magnetic coupling as shown in FIG. 7, coupling the adjustable capacitance 720 from the positive input of the primary side 711 to the non-inverting output of the secondary side 712; and coupling the adjustable capacitance 730 from the negative input of the primary side 711 to the inverting output of the secondary side 712, creates a notch filter response at the output nodes 718 and 719.

In an exemplary embodiment, coupling the adjustable capacitance 720 from the positive input of the primary side 711 to the non-inverting output of the secondary side 712; and coupling the adjustable capacitance 730 from the negative input of the primary side 711 to the inverting output of the secondary side 712 creates an ultra-compact transformer-based matching network with tunable notch filter and low insertion loss at mmW frequencies.

To effectively create a notch filter response using a transformer having a negative magnetic coupling, such as the transformer 710, additional conductive traces may be used to couple the adjustable capacitance 720 from the positive input of the primary side 711 to the non-inverting output of the secondary side 712; and may be used to couple the adjustable capacitance 730 from the negative input of the primary side 711 to the inverting output of the secondary side 712.

Values for certain of the elements in FIGS. 6 and 7 are included in these figures for illustrative purposes only. Those of skill in the art will understand that these values are only examples and that elements having values other than those indicated in FIGS. 6 and 7 may be implemented. Further, while multiple elements are represented with the same letter designation (e.g., C, L, $C_C$), all of the multiple elements represented with the same letter may or may not have the same values.

Figure 8:
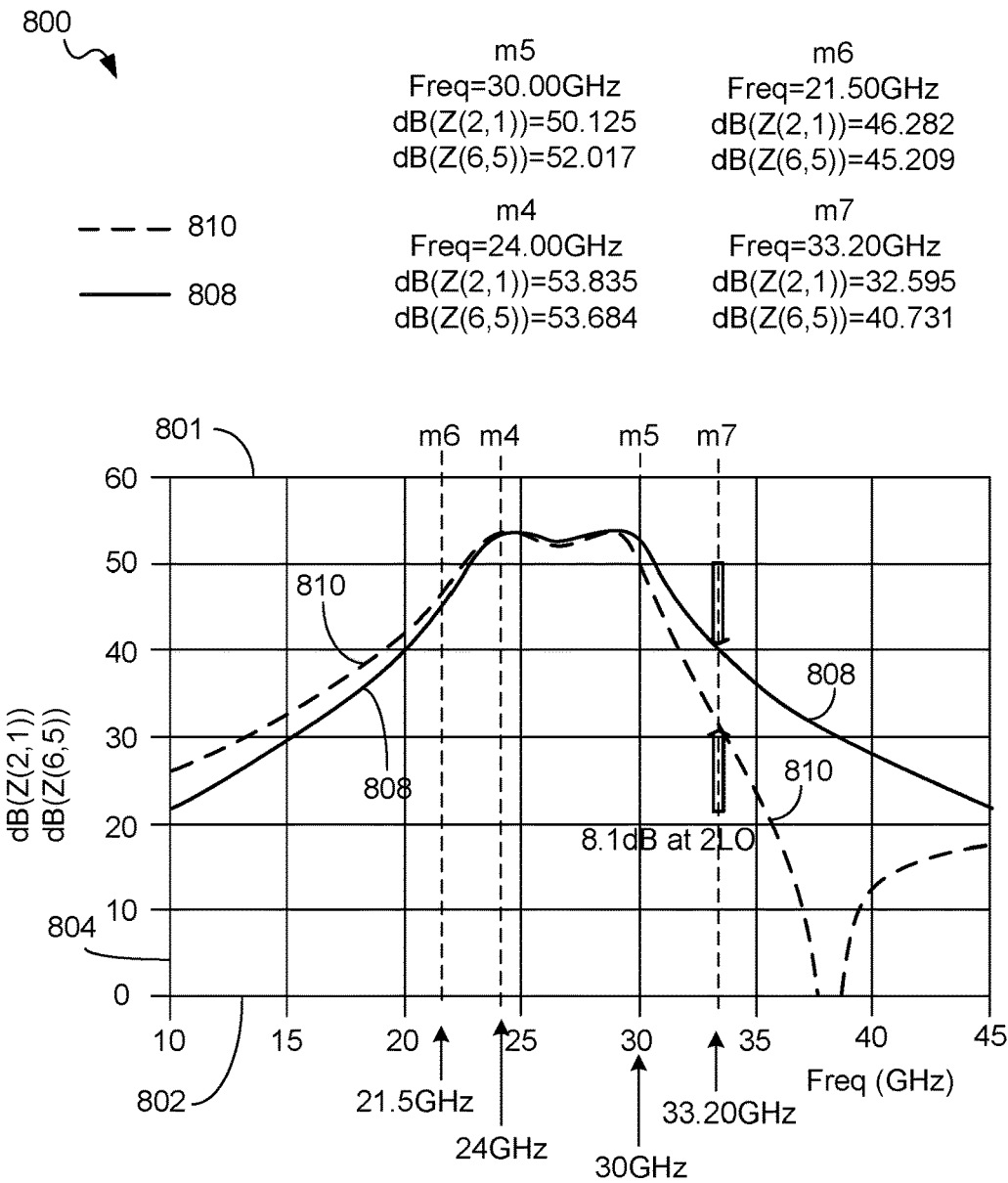
FIG. 8 is a diagram showing exemplary filter responses in accordance with an exemplary embodiment of the disclosure.
Figure 8:
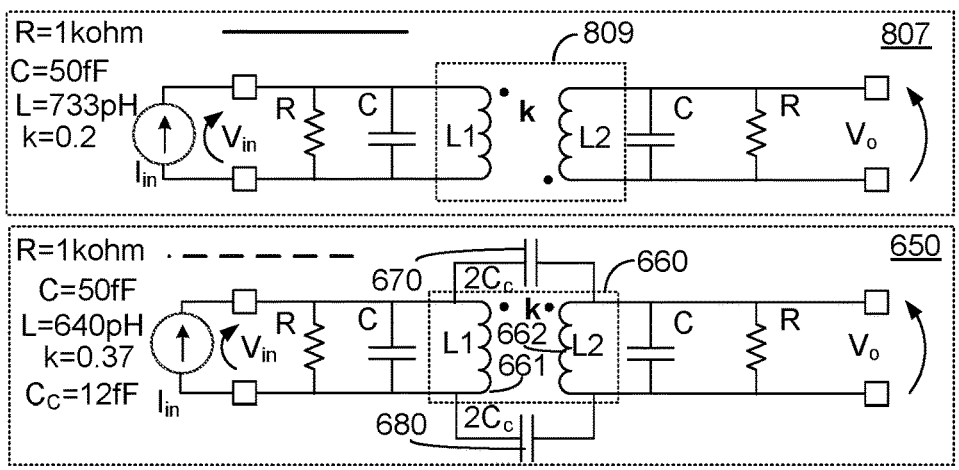

FIG. 8 is a diagram 800 showing exemplary filter responses in accordance with an exemplary embodiment of the disclosure. The diagram 800 includes a graph 801 having a horizontal axis 802 showing frequency in GHz increasing to the right, and a vertical axis 804 showing signal energy, or power in dB, increasing upwardly.

In an exemplary embodiment, a trace 808 corresponds to a frequency response of a matching network 807 in which a transformer 809 is implemented with a negative coupling factor and having no interwinding capacitances. In an exemplary embodiment, in the matching network 807, the value of the resistors, R, is 1 kOhm, the value of the capacitors, C, is 50 femtoFarads (fF) the value of the inductances, L, is 733 picoHenrys (pH), and the coupling factor, k, is 0.2, leading to the response shown by the trace 808.

In an exemplary embodiment, a trace 810 corresponds to a frequency response of a matching network 650 (having similar components, but with different values, to the matching network 600 of FIG. 6) in which a transformer 660 is implemented with a positive coupling factor and interwinding capacitances 670 and 680 are coupled across the primary side 661 and secondary side 662 of a transformer 660. Details of the matching network 650 which are similar to the matching network 600 of FIG. 6 are not repeated. However, in the exemplary matching network 650 shown in FIG. 8, the value of the resistors, R, is 1 kOhm, the value of the capacitors, C, is 50 femtoFarads (fF) the value of the inductances, L, is 640 picoHenrys (pH), the value of the interwinding capacitances, $C_C$, is 12 fF and the coupling factor, k, is 0.37, leading to the response shown by the trace 810.

As shown by the graph 801, at a frequency of 33.20 GHz (m7), which may be a 2LO frequency for a communication band, there is an 8.1 dB improvement in the filter performance of the matching network 650 (trace 810), over the matching network 807 (trace 808). In this manner, a notch response can be created above the frequency band (out-of-band) of interest (for example, a communication band spanning approximately 24 GHz (m4) to 30 GHz (m5)) to improve signal rejection at 33.20 GHz in this example.

Figure 9:
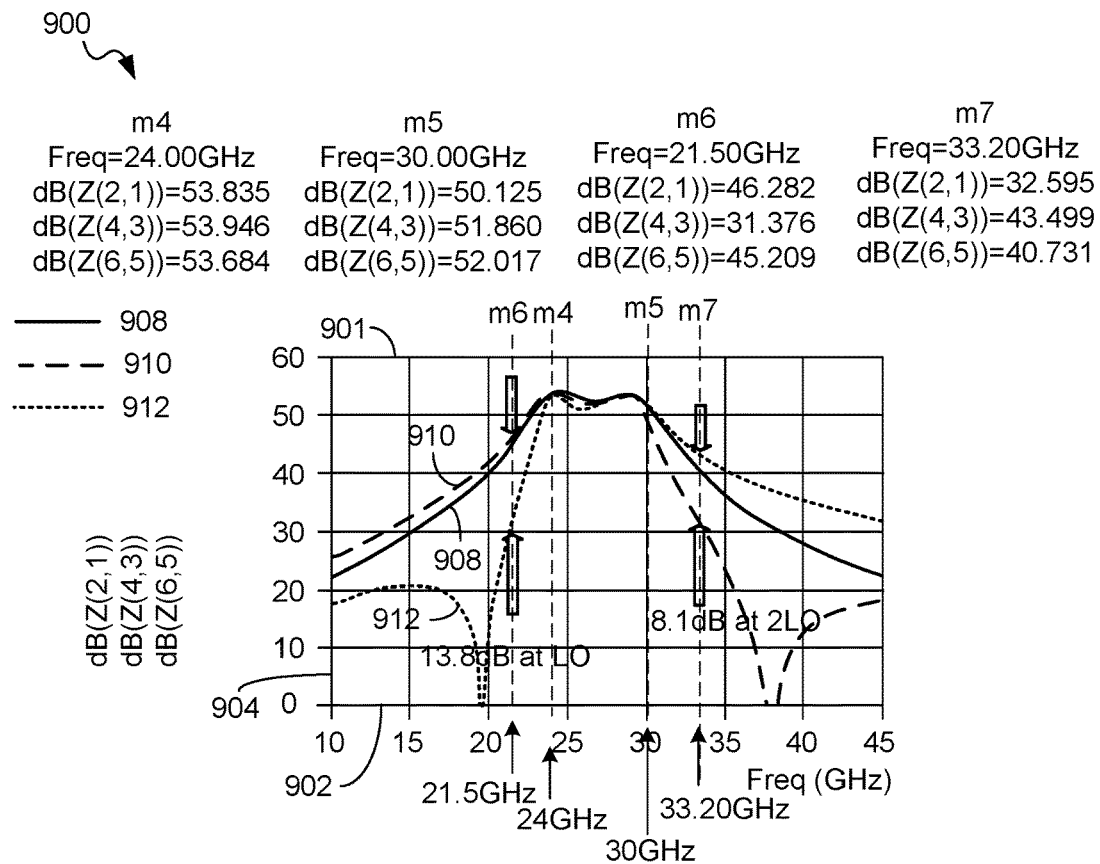
FIG. 9 is a diagram showing exemplary filter responses in accordance with an exemplary embodiment of the disclosure.
Figure 9:
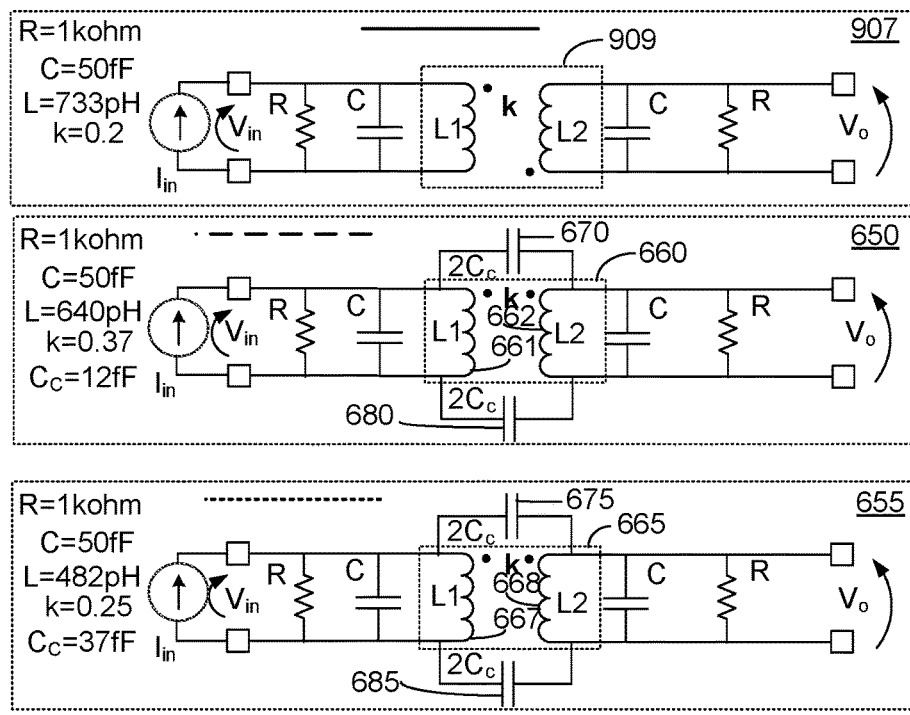

FIG. 9 is a diagram 900 showing exemplary filter responses in accordance with an exemplary embodiment of the disclosure. The diagram 900 includes a graph 901 having a horizontal axis 902 showing frequency in GHz increasing to the right, and a vertical axis 904 showing signal energy, or power in dB, increasing upwardly.

In an exemplary embodiment, a trace 908 corresponds to a frequency response of a matching network 907 in which a transformer 909 is implemented with a negative coupling factor and having no interwinding capacitances. In an exemplary embodiment, in the matching network 907, the value of the resistors, R, is 1 kOhm, the value of the capacitors, C, is 50 femtoFarads (fF) the value of the inductances, L, is 733 picoHenrys (pH), and the coupling factor, k, is 0.2, leading to the response shown by the trace 908.

In an exemplary embodiment, a trace 910 corresponds to a frequency response of a matching network 650 (similar to the matching network 650 of FIG. 8) in which a transformer 660 is implemented with a positive coupling factor and interwinding capacitances 670 and 680 are coupled across the primary side 661 and secondary side 662 of the transformer 660. Details of the matching network 650 are similar to the matching network 600 of FIG. 6 and are not repeated. The response of the matching network 650 is similar to that illustrated in FIG. 8, and is reproduced again (shown by the trace 910) in FIG. 9 for discussion.

In an exemplary embodiment, a trace 912 corresponds to a frequency response of a matching network 655 (having similar components, but with different values, to the matching network 650 of FIG. 8 and FIG. 9) in which a transformer 665 is implemented with a positive coupling factor and interwinding capacitances 675 and 685 are coupled across the primary side 667 and secondary side 668 of the transformer 665. Details of the matching network 655 which are similar to the matching network 650 are not repeated. However, in the exemplary matching network 655 shown in FIG. 9, the value of the resistors, R, is 1 kOhm, the value of the capacitors, C, is 50 femtoFarads (fF) the value of the inductances, L, is 482 picoHenrys (pH), the value of the interwinding capacitances, $C_C$, is 37 fF and the coupling factor, k, is 0.25, leading to the response shown by the trace 912.

As shown by the graph 901, at a frequency of 33.20 GHz (m7), which may be a 2LO frequency for a communication band, there is an 8.1 dB improvement in the filter performance (signal rejection) of the matching network 650 (trace 910), over the matching network 907 (trace 908). In addition, at a frequency of 21.50 GHz (m6), which may be an LO frequency for a communication band, there is a 13.8 dB improvement in the filter performance (signal rejection) of the matching network 655 (trace 912), over the matching network 907 (trace 908). In this manner, a notch response can be created above and/or below the frequency band of interest (for example, 24 GHz (m4) to 30 GHz (m5)) to improve signal rejection at one or more frequencies.

Figure 10:
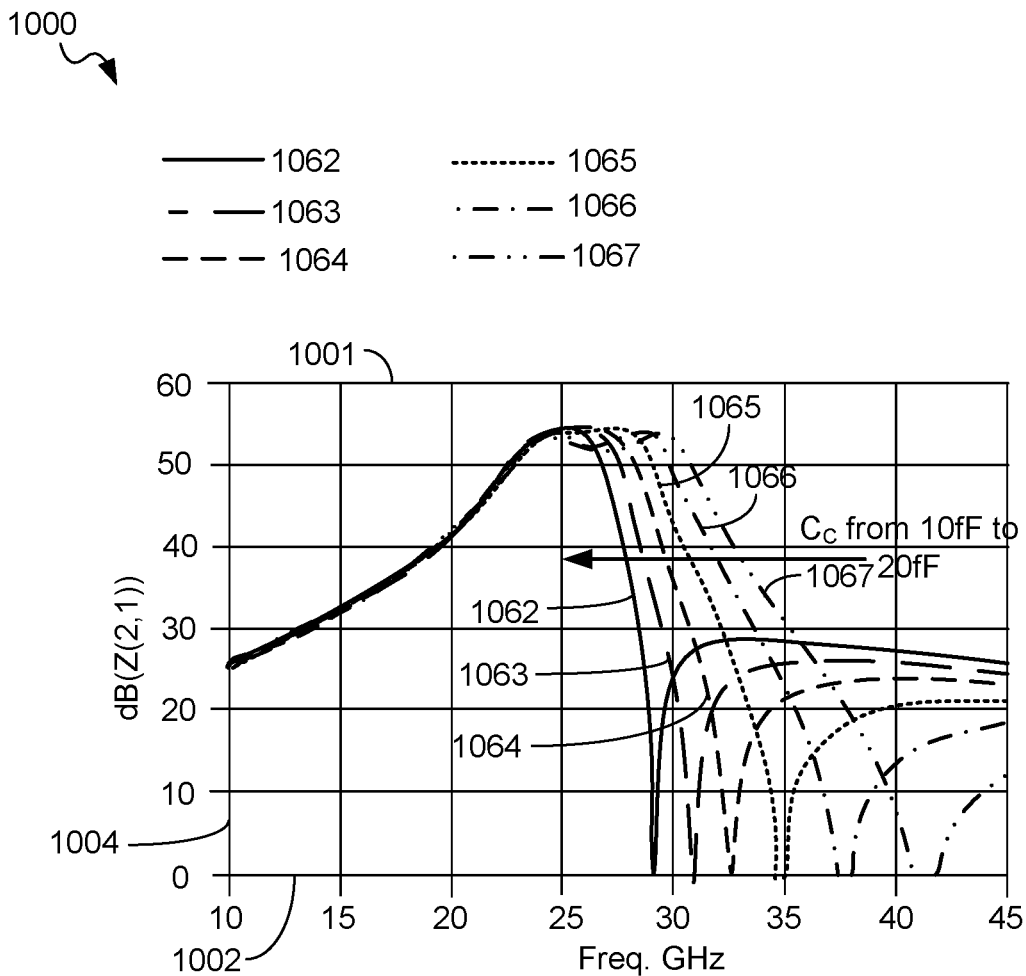
FIG. 10 is a diagram showing exemplary filter responses in accordance with an exemplary embodiment of the disclosure.
Figure 10:
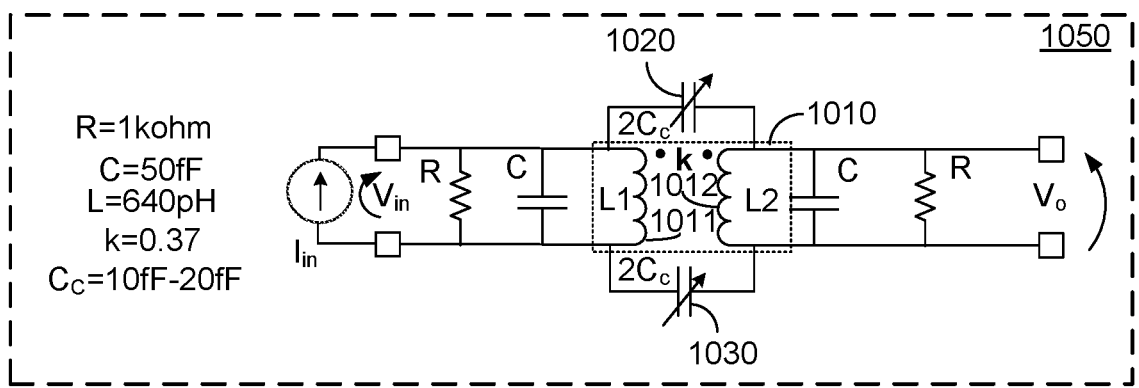

FIG. 10 is a diagram 1000 showing exemplary filter responses in accordance with an exemplary embodiment of the disclosure. The diagram 1000 includes a graph 1001 having a horizontal axis 1002 showing frequency in GHz increasing to the right, and a vertical axis 1004 showing signal energy, or power in dB, increasing upwardly.

The graph 1001 shows a series of traces 1062, 1063, 1064, 1065, 1066 and 1067 showing exemplary filter responses corresponding to values of the interwinding capacitances $C_C$, that range from approximately 10 fF to approximately 20 fF.

For example, a matching network 1050 (having similar components, but with different values, to the matching network 650 of FIG. 8) may comprise a transformer 1010 implemented with a positive coupling factor and may include interwinding adjustable capacitances 1020 and 1030 coupled across the primary side 1011 and secondary side 1012 of the transformer 1010. Details of the matching network 1050 similar to the matching network 600 of FIG. 6 are not repeated. In the exemplary matching network 1050 shown in FIG. 10, the value of the resistors, R, is 1 kOhm, the value of the capacitors, C, is 50 femtoFarads (fF) the value of the inductances, L, is 640 picoHenrys (pH); however, the value of the interwinding capacitances, $C_C$, may range from, for example, approximately 10 fF to approximately 20 fF, and the coupling factor, k, is 0.37, leading to the responses shown by the traces 1062, 1063, 1064, 1065, 1066 and 1067. For example, the trace 1067 shows the notch response when $C_C$ is 10 fF, and the trace 1062 shows the notch response when CC is 20 fF. The capacitance of the interwinding adjustable capacitances 1020 and 1030 may be controlled by a signal from the data processor 210 of FIG. 2A or FIG. 2B. The interwinding adjustable capacitances 1020 and 1030 may be implemented using capacitor banks, adjustable transistor devices, or other technologies. In an exemplary embodiment, the matching network 1050 may be implemented to provide a selectable notch response on a higher frequency side of the passband 366 (FIG. 3C).

Figure 11:
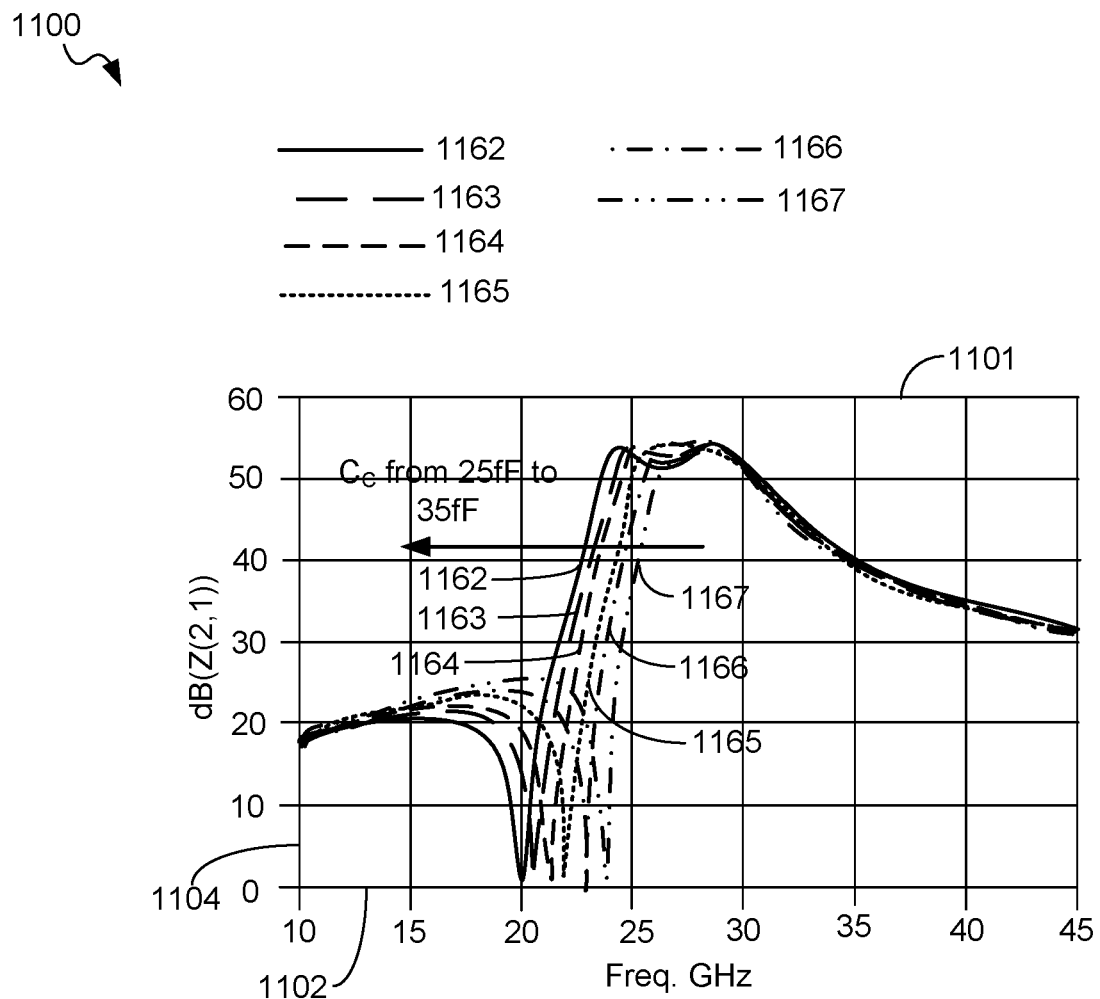
FIG. 11 is a diagram showing exemplary filter responses in accordance with an exemplary embodiment of the disclosure.
Figure 11:
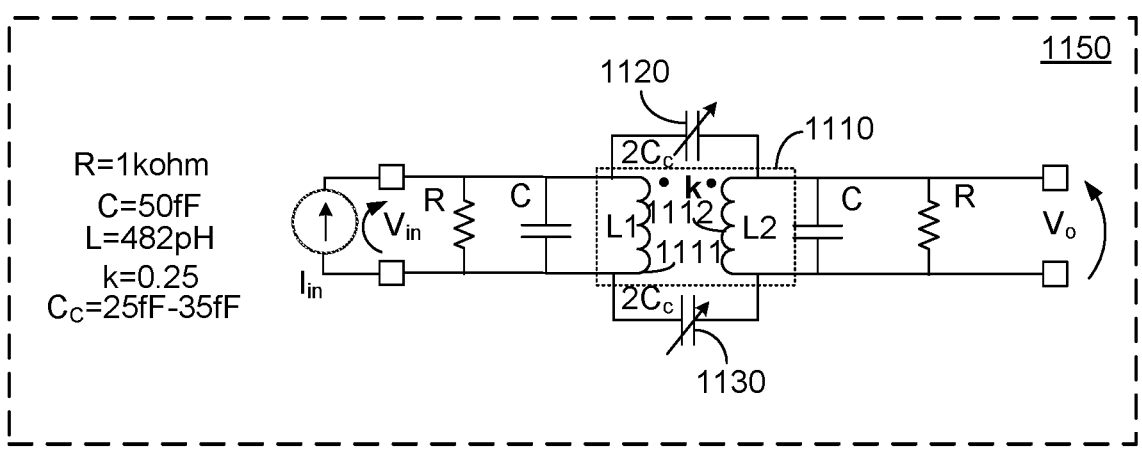

FIG. 11 is a diagram 1100 showing exemplary filter responses in accordance with an exemplary embodiment of the disclosure. The diagram 1100 includes a graph 1101 having a horizontal axis 1102 showing frequency in GHz increasing to the right, and a vertical axis 1104 showing signal energy, or power in dB, increasing upwardly.

The graph 1101 shows a series of traces 1162, 1163, 1164, 1165, 1166 and 1167 showing exemplary filter responses corresponding to values of the interwinding capacitances $C_C$, that range from approximately 25 fF to approximately 35 fF.

For example, a matching network 1150 (having similar components, but with different values, to the matching network 650 of FIG. 8) may comprise a transformer 1110 implemented with a positive coupling factor and may include interwinding capacitances 1120 and 1130 coupled across the primary side 1111 and secondary side 1112 of the transformer 1110. Details of the matching network 1150 which are similar to the matching network 600 of FIG. 6 are not repeated. In the exemplary matching network 1150 shown in FIG. 11, the value of the resistors, R, is 1 kOhm, the value of the capacitors, C, is 50 femtoFarads (fF) the value of the inductances, L, is 482 picoHenrys (pH); however, the value of the interwinding capacitances, $C_C$, may range from, for example, approximately 25 fF to approximately 35 fF, and the coupling factor, k, is 0.37, leading to the responses shown by the traces 1162, 1163, 1164, 1165, 1166 and 1167. For example, the trace 1167 shows the notch response when $C_C$ is 25 fF, and the trace 1162 shows the notch response when $C_C$ is 35 fF. The capacitance of the interwinding adjustable capacitances 1120 and 1130 may be controlled by a signal from the data processor 210 of FIG. 2A or FIG. 2B. The interwinding adjustable capacitances 1120 and 1130 may be implemented using capacitor banks, adjustable transistor devices, or other technologies. In an exemplary embodiment, the matching network 1150 may be implemented to provide a selectable notch response on a lower frequency side of the passband 366 (FIG. 3C).

Figure 12:
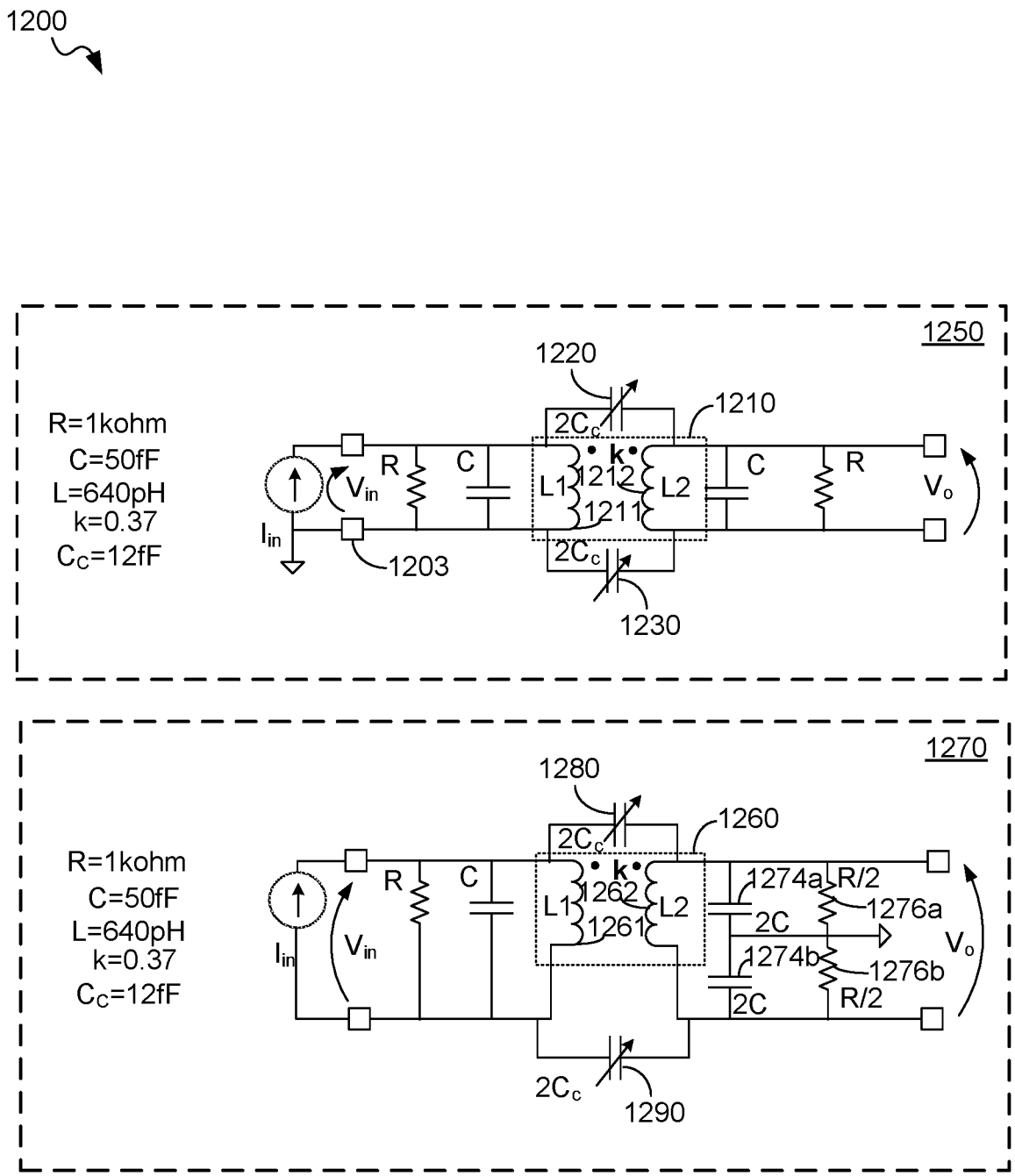
FIG. 12 is a diagram showing exemplary embodiments of matching networks in accordance with an exemplary embodiment of the disclosure.

FIG. 12 is a diagram 1200 showing exemplary embodiments of matching networks in accordance with an exemplary embodiment of the disclosure.

For example, a matching network 1250 (having similar components, but with different values, to the matching network 600 of FIG. 6 and matching network 650 of FIG. 8) may comprise a transformer 1210 implemented with a positive coupling factor and may include interwinding capacitances 1220 and 1230 coupled across the primary side 1211 and secondary side 1212 of the transformer 1210. Details of the matching network 1250 similar to the matching network 600 of FIG. 6 are not repeated. The exemplary matching network 1250 shown in FIG. 12 shows a single-ended to differential embodiment of the matching network 600 of FIG. 6. In the exemplary embodiment shown in FIG. 12, the input node 1203 (IN−) is coupled to system ground so that the input side of the matching network 1250 is single-ended and there is no low impedance path to ground in either common-mode or differential-mode. The capacitance of the interwinding adjustable capacitances 1220 and 1230 may be controlled by a signal from the data processor 210 of FIG. 2A or FIG. 2B. The interwinding adjustable capacitances 1220 and 1230 may be implemented using capacitor banks, adjustable transistor devices, or other technologies.

Another exemplary embodiment of a matching network 1270 is also shown. The matching network 1270 is a differential matching network in which the output side includes capacitances 1274a and 1274b each having a value 2C; and includes resistances 1276a and 1276b, each having a resistance R/2. The center node between the capacitances 1274a and 1274b, and the center node between the resistances 1276a and 1276b is coupled to system ground such that the output side maintains the load impedance in differential mode, particularly when a differential amplifier (not shown) is used as a load.

The capacitance of the interwinding adjustable capacitances 1280 and 1290 may be controlled by a signal from the data processor 210 of FIG. 2A or FIG. 2B. The interwinding adjustable capacitances 1280 and 1290 may be implemented using capacitor banks, adjustable transistor devices, or other technologies. The interwinding capacitances 1280 and 1290 may be coupled across primary side 1261 and secondary side 1262 of transformer 1260, which may be implemented with a positive coupling factor.

Values for certain of the elements in FIGS. 12A and 12B are included in these figures for illustrative purposes only. Those of skill in the art will understand that these values are only examples and that elements having values other than those indicated in FIGS. 12A and 12B may be implemented. Further, while multiple elements are represented with the same letter designation (e.g., C, L, $C_C$), all of the multiple elements represented with the same letter may or may not have the same values.

Figure 13:
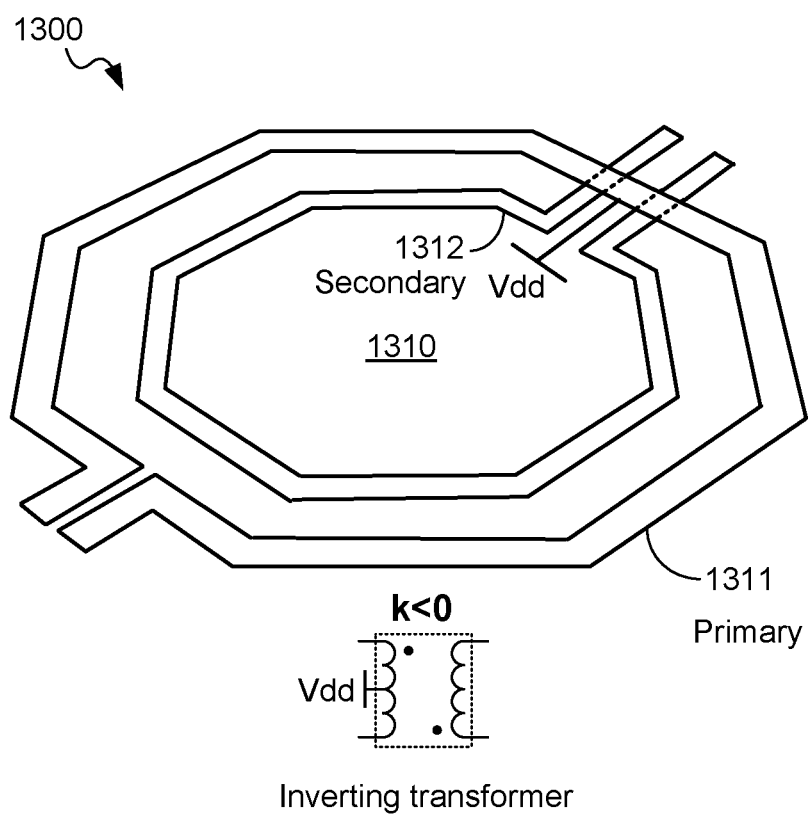
FIG. 13 is a diagram showing an exemplary on-chip transformer.

FIG. 13 is a diagram 1300 showing an exemplary on-chip implementation of a transformer 1310. The transformer 1310 includes a primary side 1311 and a secondary side 1312, and is an example of an inverting transformer having a coupling factor, k, of less than 0 (k<0).

Figure 14:
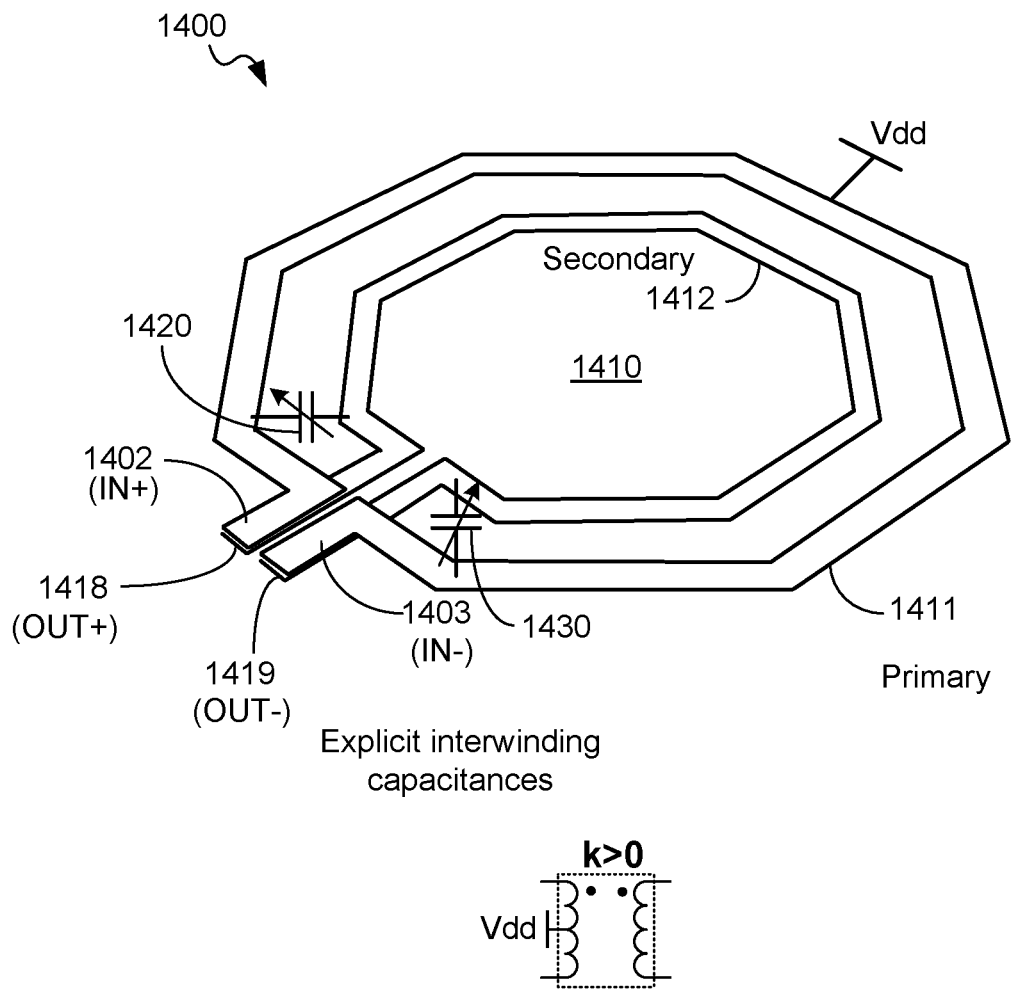
FIG. 14 is a diagram showing an exemplary on-chip transformer in accordance with an exemplary embodiment of the disclosure.

FIG. 14 is a diagram 1400 showing an exemplary on-chip implementation of a transformer 1410 in accordance with an exemplary embodiment of the disclosure. The transformer 1410 includes a primary side 1411 and a secondary side 1412, and is an example of a non-inverting transformer having a coupling factor, k, of greater than 0 (k>0).

In an exemplary embodiment, the transformer 1410 is an example of a differential implementation, where the transformer primary side 1411 has an input node 1402 (IN+) and an input node 1403 (IN−); and the secondary side 1412 has an output node 1418 (OUT+) and an output node 1419 (OUT−).

The exemplary transformer 1410 also comprises explicit interwinding adjustable capacitances 1420 and 1430. The transformer 1410 may be implemented in accordance with exemplary embodiments of the matching network described herein.

In an exemplary embodiment, the interwinding adjustable capacitance 1420 may be coupled between the input (IN+) at node 1402 and the non-inverting output (OUT+) at the node 1418 of the transformer 1410 (i.e., in_plus (IN+) is connected to out_plus (OUT+)); and the interwinding adjustable capacitance 1430 may be coupled between the input (IN−) at node 1403 and the inverting output (OUT−) at the node 1419 of the transformer 1410 (i.e., in_minus (IN−) is connected to out_minus (OUT−)).

Figure 15:
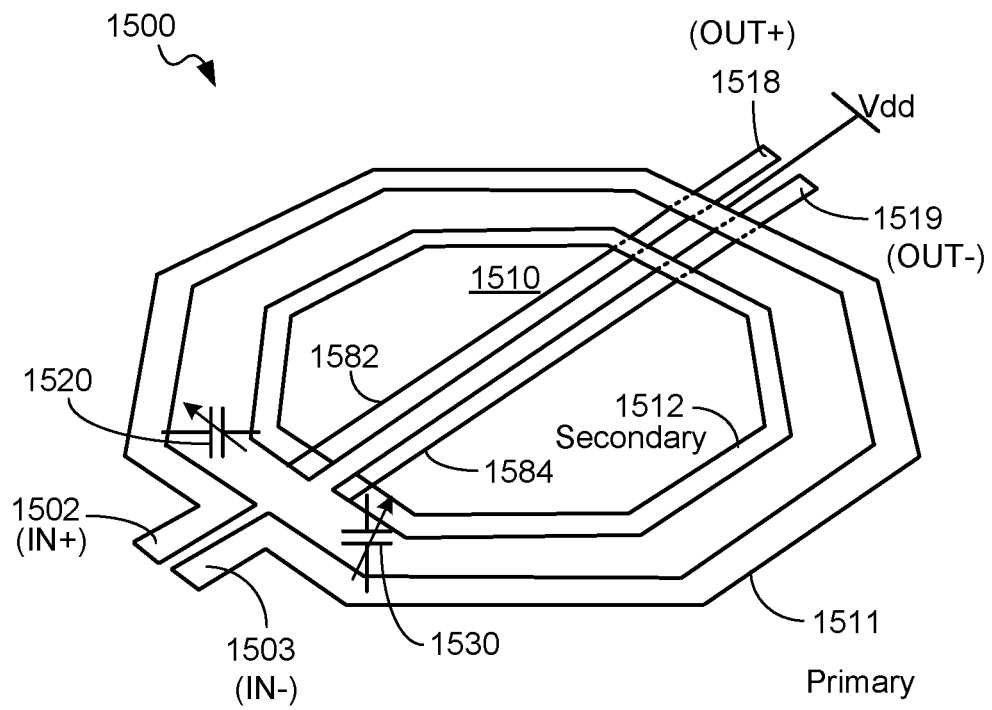
FIG. 15 is a diagram showing an exemplary on-chip transformer in accordance with an exemplary embodiment of the disclosure.
Figure 15:
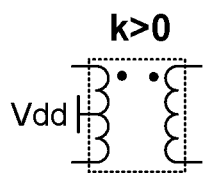

FIG. 15 is a diagram 1500 showing an exemplary on-chip implementation of a transformer 1510 in accordance with an exemplary embodiment of the disclosure. The transformer 1510 includes a primary side 1511 and a secondary side 1512, and is an example of a non-inverting transformer having a coupling factor, k, of greater than 0 (k>0).

The transformer 1510 is similar to the transformer 1410 of FIG. 14; however, the transformer 1510 also includes segments 1582 and 1584 configured to provide the output of the transformer 1510 to the side opposite that of the input of the transformer 1510.

In an exemplary embodiment, the transformer 1510 is an example of a differential implementation, where the transformer primary side 1511 has an input node 1502 (IN+) and an input node 1503 (IN−); and the secondary side 1512 has an output node 1518 (OUT+) and an output node 1519 (OUT−).

The exemplary transformer 1510 also comprises explicit interwinding adjustable capacitances 1520 and 1530. The transformer 1510 may be implemented in accordance with exemplary embodiments of the matching network described herein.

In an exemplary embodiment, the interwinding adjustable capacitance 1520 may be coupled between the input (IN+) at node 1502 and the non-inverting output (OUT+) at the node 1518 of the transformer 1510 (i.e., in_plus (IN+) is connected to out_plus (OUT+)); and the interwinding adjustable capacitance 1530 may be coupled between the input (IN−) at node 1503 and the inverting output (OUT−) at the node 1519 of the transformer 1510 (i.e., in_minus (IN−) is connected to out_minus (OUT−)).

Figure 16:
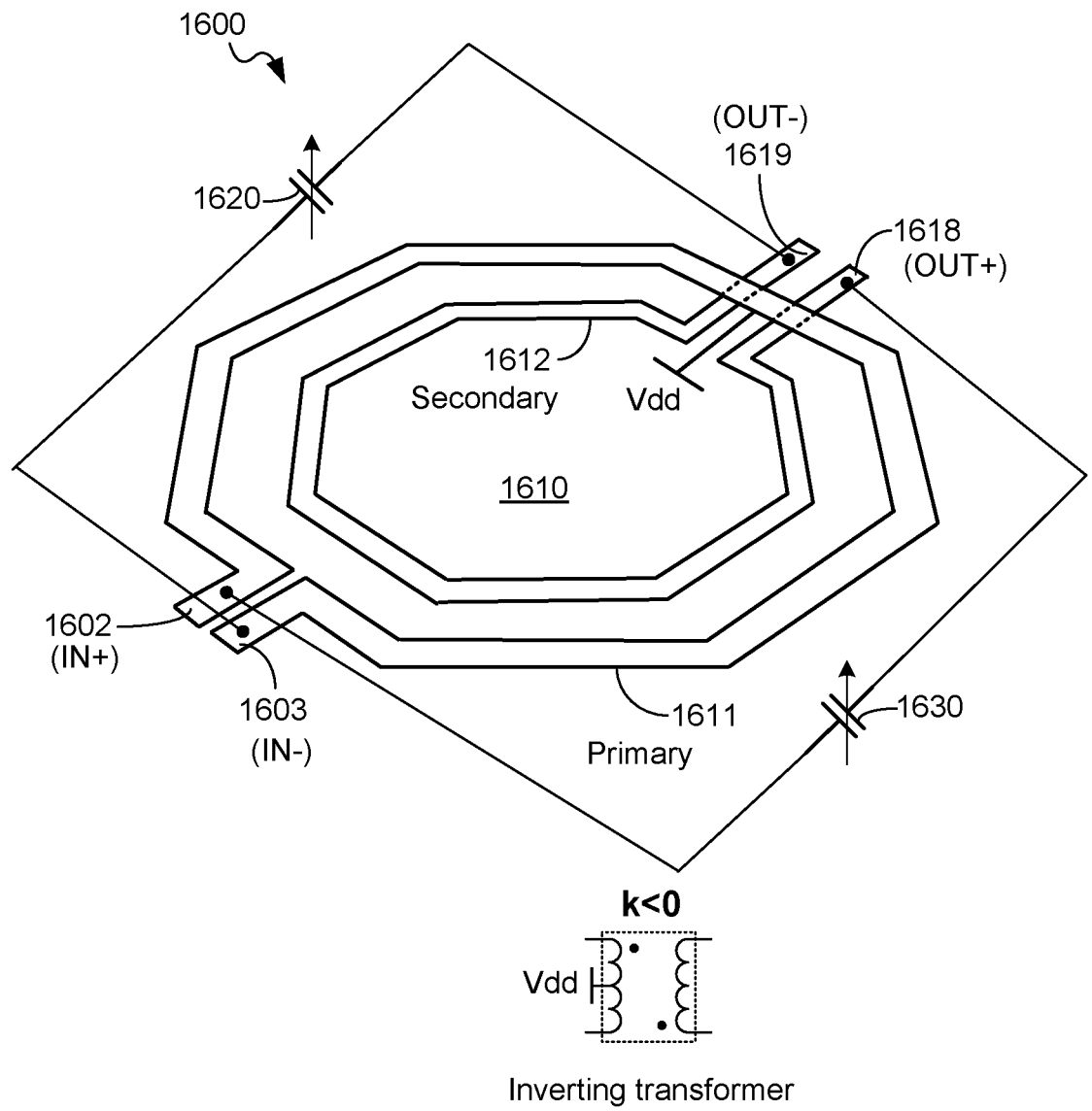
FIG. 16 is a diagram showing an exemplary on-chip transformer in accordance with an exemplary embodiment of the disclosure.

FIG. 16 is a diagram 1600 showing an exemplary on-chip implementation of a transformer 1610 in accordance with an exemplary embodiment of the disclosure. The transformer 1610 includes a primary side 1611 and a secondary side 1612, and is an example of an inverting transformer having a coupling factor, k, of less than 0 (k<0).

In an exemplary embodiment, the transformer 1610 is an example of a differential implementation, where the transformer primary side 1611 has an input node 1602 (IN+) and an input node 1603 (IN−); and the secondary side 1612 has an output node 1618 (OUT+) and an output node 1619 (OUT−).

The exemplary transformer 1610 also comprises explicit interwinding adjustable capacitances 1620 and 1630. The transformer 1610 may be implemented in accordance with exemplary embodiments of the matching network described herein.

In an exemplary embodiment, because the transformer 1610 is an inverting transformer, the interwinding adjustable capacitance 1620 may be coupled between the input (IN−) at node 1603 and the inverting output (OUT−) at the node 1619 of the transformer 1610 (i.e., in_minus (IN−) is connected to out_minus (OUT−)); and the interwinding adjustable capacitance 1630 may be coupled between the input (IN+) at node 1602 and the non-inverting output (OUT+) at the node 1618 of the transformer 1610 (i.e., in_plus (IN+) is connected to out_plus (OUT+)). In this manner, the interwinding adjustable capacitances 1620 and 1630 can be implemented with an inverting transformer, and still provide the desired notch filter response as described herein.

To effectively create a notch filter response using a transformer having a negative magnetic coupling, such as the transformer 1610, additional conductive traces may be used to couple the adjustable capacitance 1620 from the negative input of the primary side 1611 to the inverting output of the secondary side 1612; and may be used to couple the adjustable capacitance 1630 from the positive input of the primary side 1611 to the non-inverting output of the secondary side 1612.

Figure 17:
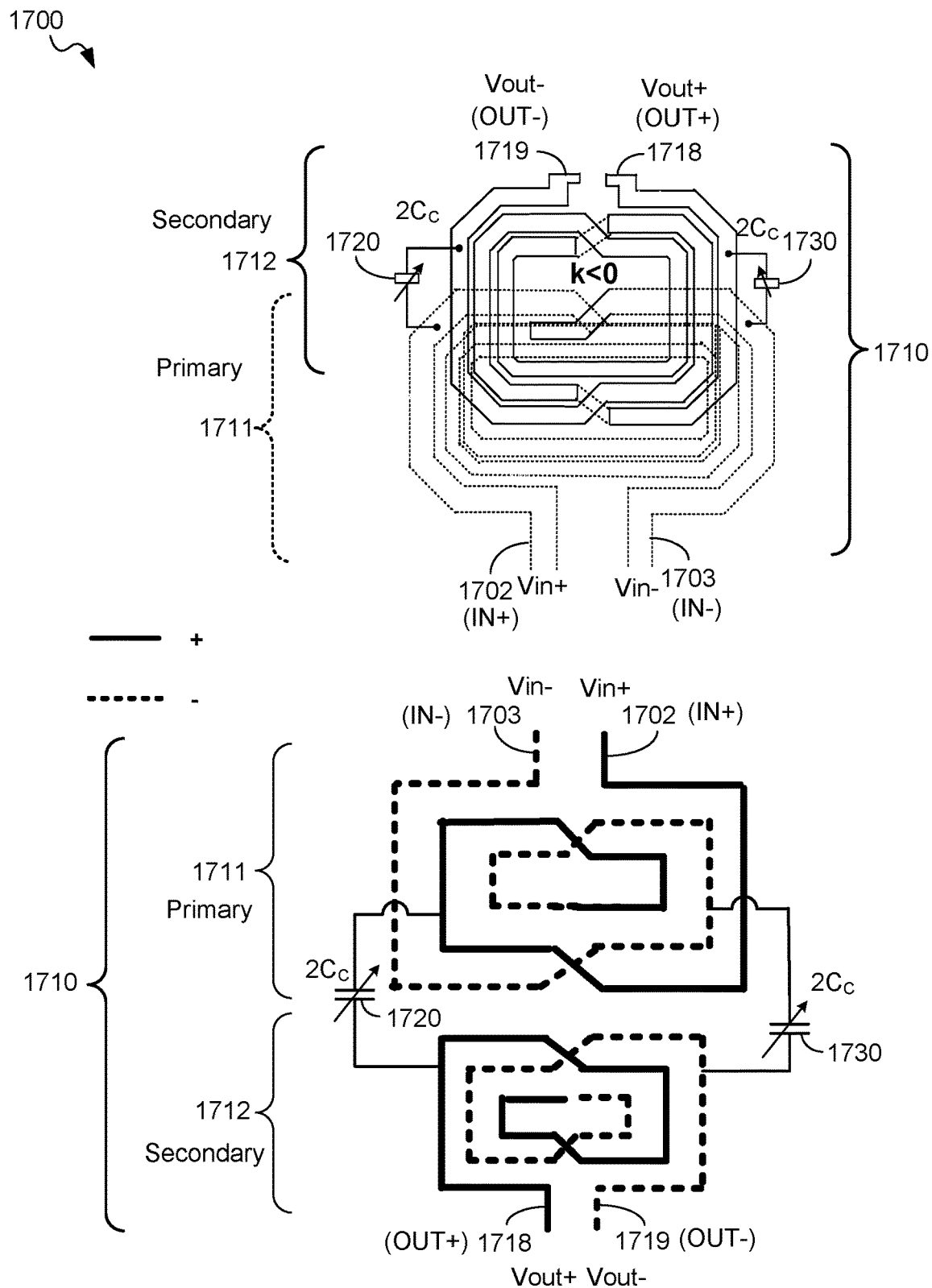
FIG. 17 is a diagram showing an exemplary on-chip transformer in accordance with an exemplary embodiment of the disclosure.

FIG. 17 is a diagram 1700 showing an exemplary on-chip implementation of a transformer 1710 in accordance with an exemplary embodiment of the disclosure. The transformer 1710 is implemented as a multi-turn transformer arranged to have a negative magnetic coupling (k<0).

By leveraging multi-turn inductances, such as the primary side 1711 and the secondary side 1712, the connection between Vin+/Vo+ and Vin−/Vo− may be realized without affecting the design of the transformer. For example, the transformer 1710 may be constructed using any advanced nanometer-scale CMOS (complementary metal oxide semiconductor) technology and may operate at millimeter-wave frequencies of, for example, 24 GHz and beyond. A multi-turn inductor, such as the inductor of the primary side 1711 and the secondary side 1712, may be used to reduce the amount of chip area, and such an arrangement may provide good isolation from other nearby electromagnetic structures.

In an exemplary embodiment, the transformer 1710 shows a primary side 1711 and a secondary side 1712 and also shows interwinding adjustable capacitance 1720 coupling the positive input 1702 of the primary side 1711 to the positive output 1718 of the secondary side 1712 and interwinding adjustable capacitance 1730 coupling the minus input 1703 of the primary side 1711 to the minus output 1719 of the secondary side 1712.

The lower portion of the drawing 1700 shows a schematic representation of the transformer 1710 with the positive signal path shown using a solid line and the negative signal path shown using a dotted line. In an exemplary embodiment, coupling the inputs and outputs of a transformer results in parasitic inductances and capacitances. In the implementation shown in FIG. 17, the routing of the transformer inductances may be used to reduce or minimize parasitic inductances by coupling the interwinding adjustable capacitance 1720 to the positive signal path of the primary side 1711 and secondary side 1712; and coupling the interwinding adjustable capacitance 1730 to the negative signal path of the primary side 1711 and secondary side 1712 as shown, which may result in no additional parasitic capacitances. In this manner the interwinding adjustable capacitance 1720 and the interwinding adjustable capacitance 1730 may be included without any additional connections that may cause additional parasitics. In some aspects, a first input of a first winding is coupled to a first output of a second winding when a first point on the first winding, which first point is nearer to the first input of the first winding than to a second input of the first winding when measured along the path of the first winding, is coupled to a second point on the second winding, which second point is nearer to the first output of the second winding than to a second output of the second winding when measured along the path of the second winding.

Figure 18:
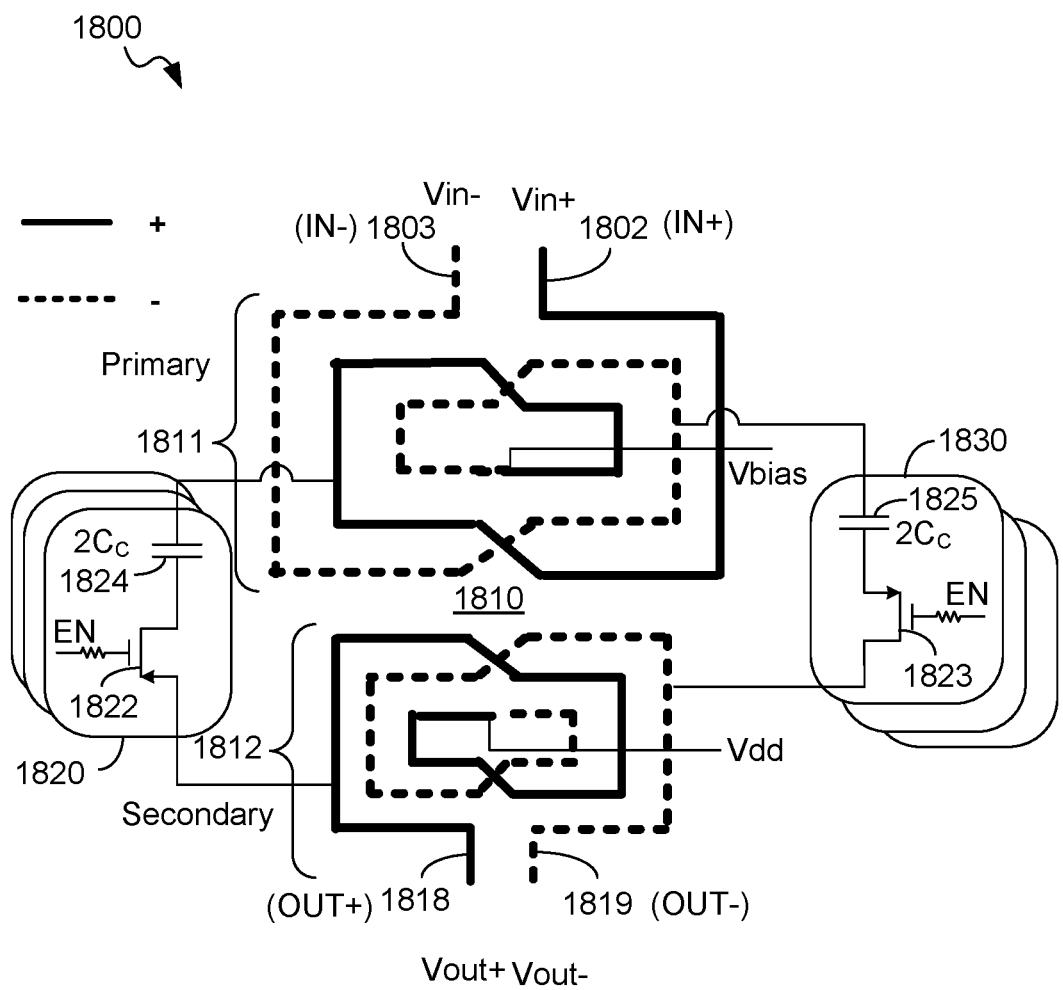
FIG. 18 is a diagram showing an exemplary schematic diagram of an adjustable capacitance circuit used with an on-chip transformer in accordance with an exemplary embodiment of the disclosure.

FIG. 18 is a diagram 1800 showing an exemplary schematic diagram of an adjustable capacitance circuit used with an on-chip transformer in accordance with an exemplary embodiment of the disclosure. In an exemplary embodiment, the interwinding capacitance 1820 may be created using a PMOS switch 1822 and a single capacitor 1824 to create the desired capacitance $2C_C$. Similarly, the interwinding capacitance 1830 may be created using a PMOS switch 1823 and a single capacitor 1825 to create the desired capacitance $2C_C$. Multiple instances of the interwinding capacitance 1820 and the interwinding capacitance 1830 may be implemented to create a range of capacitance values. The parasitic capacitance of the PMOS switch 1822 and the PMOS switch 1823 can be absorbed into the filter terminations and the respective interwinding capacitances 1820 and 1830, so that the PMOS switch 1822 and the PMOS switch 1823 may be considered ideal at least to the first order. When each of the PMOS switch 1822 and PMOS switch 1823 is "ON" the interwinding capacitance $2C_C$ is enabled. When each of the PMOS switch 1822 and PMOs switch 1823 is "OFF" the interwinding capacitance does not substantially affect the circuit and the notch substantially disappears from the frequency response. In an exemplary embodiment, the PMOS switch 1822 and the PMOS switch 1823 may be controlled by an enable (EN) signal, which may be provided by the data processor 210 of FIG. 2A or FIG. 2B.

Figure 19:
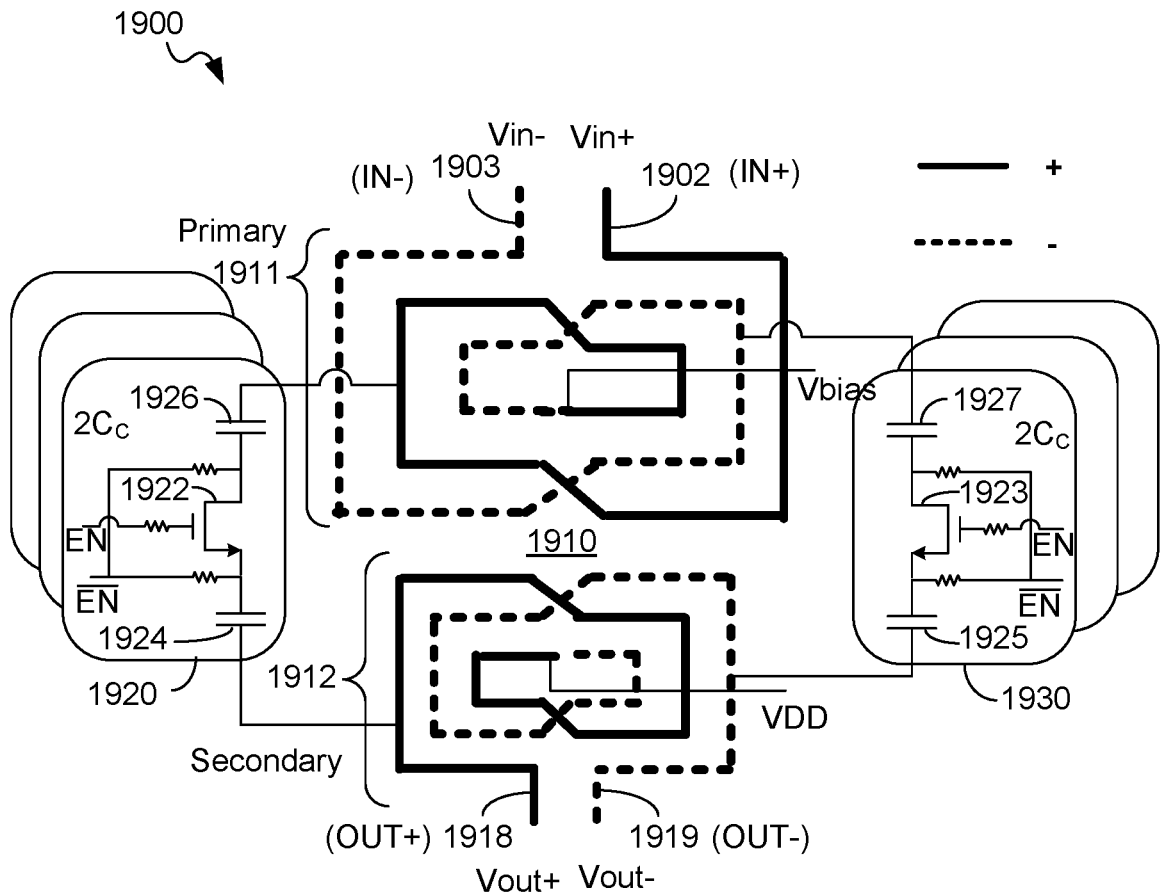
FIG. 19 is a diagram showing an exemplary schematic diagram of an adjustable capacitance circuit used with an on-chip transformer in accordance with an exemplary embodiment of the disclosure.

FIG. 19 is a diagram 1900 showing an exemplary schematic diagram of an adjustable capacitance circuit used with an on-chip transformer in accordance with an exemplary embodiment of the disclosure. In an exemplary embodiment, the interwinding capacitance 1920 may be created using an NMOS switch 1922, a first capacitor 1924 and a second capacitor 1926 to create the desired capacitance $2C_C$. Similarly, the interwinding capacitance 1930 may be created using an NMOS switch 1923, a first capacitor 1925 and a second capacitor 1927 to create the desired capacitance $2C_C$. Multiple instances of the interwinding capacitance 1920 and the interwinding capacitance 1930 may be implemented to create a range of capacitance values. In an exemplary embodiment, the NMOS switch 1922 and the NMOS switch 1923 may be controlled by an enable (EN) signal, which may be provided by the data processor 210 of FIG. 2A or FIG. 2B. In an exemplary embodiment, the drain and the source of each of the NMOS switch 1922 and the NMOS switch 1923 may be biased by an enable bar (EN_bar) (the complement of the EN) signal, which may also be provided by the data processor 210 of FIG. 2A or FIG. 2B. When the NMOS switches 1922 and 1923 are "ON" the interwinding capacitances 1920 and 1930, having respective capacitance values of $2C_C$ are enabled. When the NMOS switches 1922 and 1923 are "OFF" the interwinding capacitances do not play a substantial role and the notch substantially disappears from the frequency response.

It will be appreciated that the capacitances 1820, 1830, 1920, 1930 illustrated in FIGS. 18 and 19 may be configured to be adjustable or variable in any number of different configurations. In the illustrated configurations, any number of instances may be implemented. In some embodiments, a single instance is implemented. In other embodiments, a greater number of instances than are illustrated are implemented. Such capacitances may be configured to provide coarse tuning, fine tuning, or may be fixed or only able to turn on or off in some embodiments.

Figure 20:
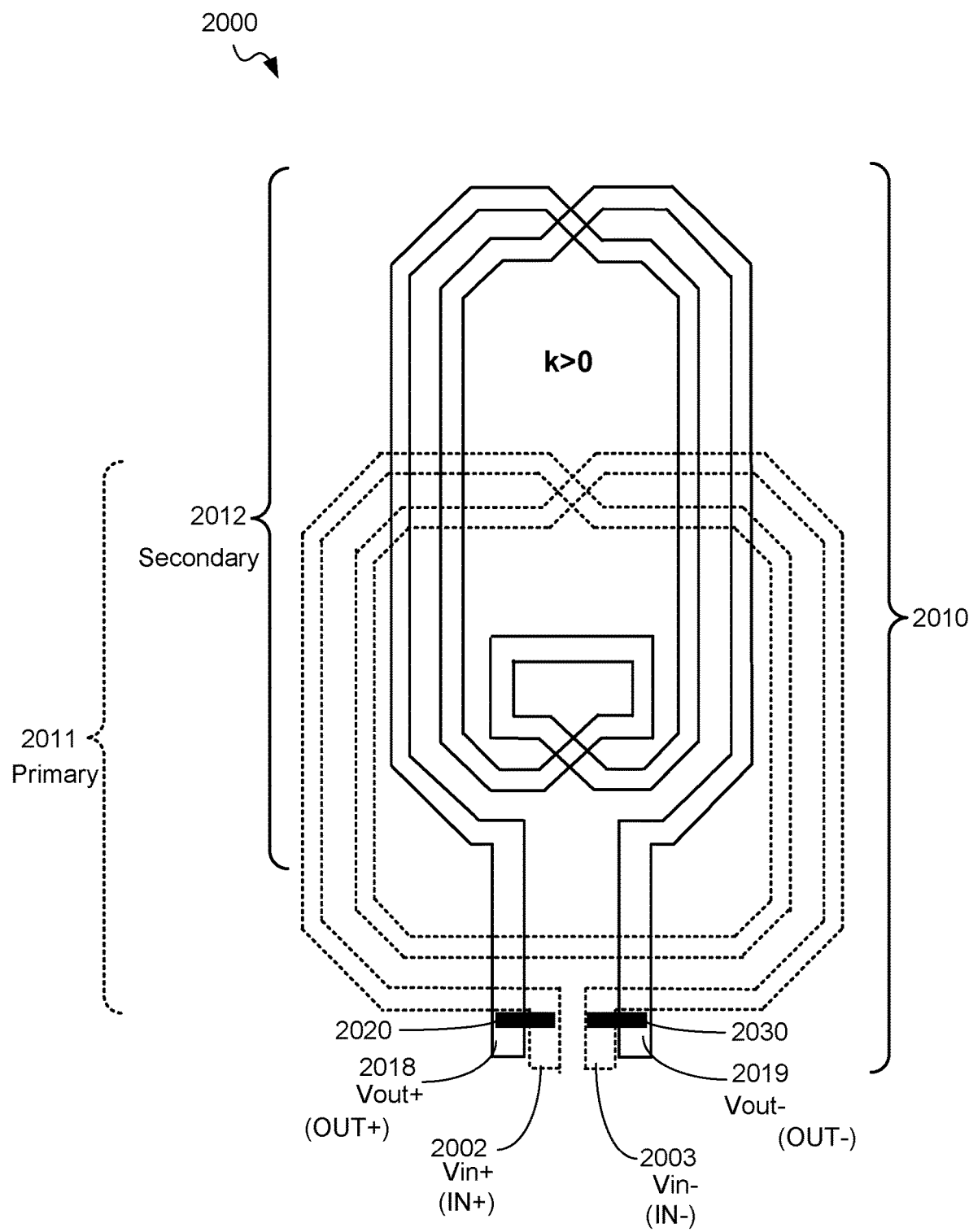
FIG. 20 is a diagram showing an exemplary on-chip transformer in accordance with an exemplary embodiment of the disclosure.

FIG. 20 is a diagram 2000 showing an exemplary on-chip transformer in accordance with an exemplary embodiment of the disclosure. The transformer 2010 is implemented as a multi-turn transformer arranged to have a positive magnetic coupling (k>0).

By leveraging multi-turn inductances, such as the primary side 2011 and the secondary side 2012, the connection between Vin+/Vo+ and Vin−/Vo− may be realized without affecting the design of the transformer. For example, the transformer 2010 may be constructed using any advanced nanometer-scale CMOS (complementary metal oxide semiconductor) technology and may operate at millimeter-wave frequencies of, for example, 24 GHz and beyond. A multi-turn inductor, such as the inductor of the primary side 2011 and the secondary side 2012, may be used to reduce the amount of chip area, and such an arrangement may provide good isolation from other nearby electromagnetic structures.

In an exemplary embodiment, the transformer 2010 shows a primary side 2011 and a secondary side 2012, and also shows interwinding adjustable capacitance 2020 coupling the positive input 2002 of the primary side 2011 to the positive output 2018 of the secondary side 2012, and interwinding adjustable capacitance 2030 coupling the minus input 2003 of the primary side 2011 to the minus output 2019 of the secondary side 2012.

Figure 21:
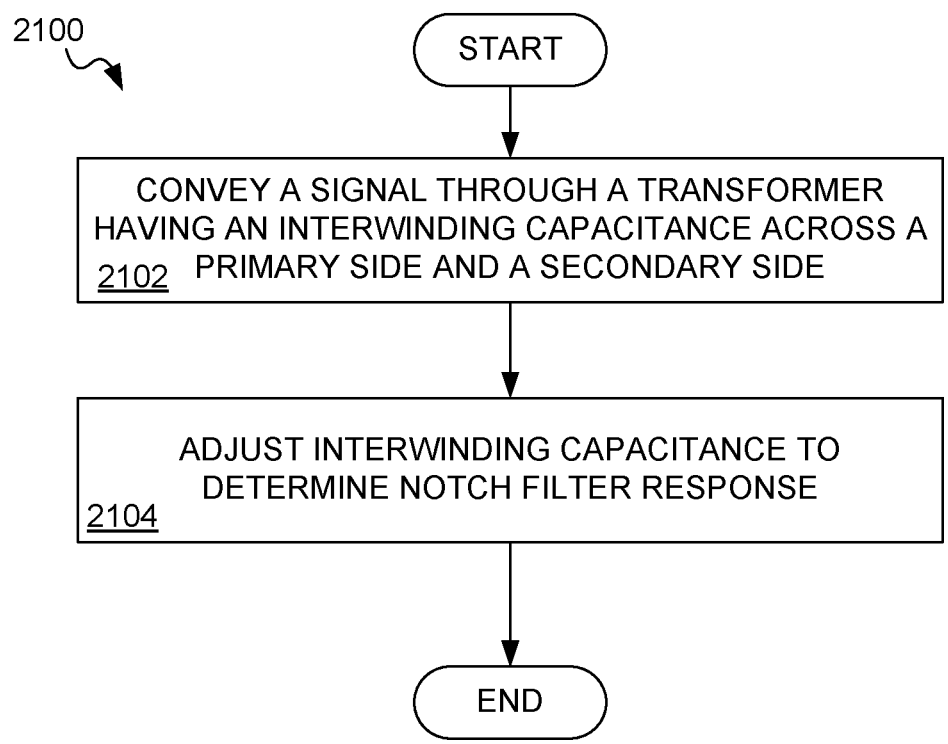
FIG. 21 is a flow chart describing an example of the operation of a method for creating a notch filter response in accordance with an exemplary embodiment of the disclosure.

FIG. 21 is a flow chart 2100 describing an example of the operation of a method for creating a notch filter response using a matching network with a tunable notch filter. The blocks in the method 2100 can be performed in or out of the order shown, and in some embodiments, can be performed at least in part in parallel.

In block 2102, a signal is conveyed through a transformer having an interwinding capacitance across a primary side and a secondary side. In an exemplary single-ended embodiment, interwinding adjustable capacitance 520 maybe coupled between the input on the primary side 511 and the non-inverting output of the secondary side 512 of the transformer 510. In an exemplary differential embodiment, interwinding adjustable capacitances 620 and 630 may be coupled across the positive and negative inputs of the primary side 611 and the corresponding non-inverting and inverting outputs of the secondary side 612 of the transformer 610. In an exemplary embodiment, the interwinding adjustable capacitance 520 may be selectively coupled between the input on the primary side 511 and the non-inverting output of the secondary side 512 of the transformer 510; or the interwinding adjustable capacitances 620 and 630 may be selectively coupled across the positive and negative inputs of the primary side 611 and the corresponding non-inverting and inverting outputs of the secondary side 612 of the transformer 610.

In block 2104, the value of the interwinding capacitance may be adjusted to determine a notch filter response. In an exemplary embodiment, the capacitance vale of the interwinding adjustable capacitance 520 or the capacitance value of the interwinding adjustable capacitances 620 and 630 may be adjusted to create a notch filter response at a desired frequency. For example, such adjustment may be effected by selectively coupling one or more (explicit) capacitances between the primary side and secondary side of the transformer.

Figure 22:
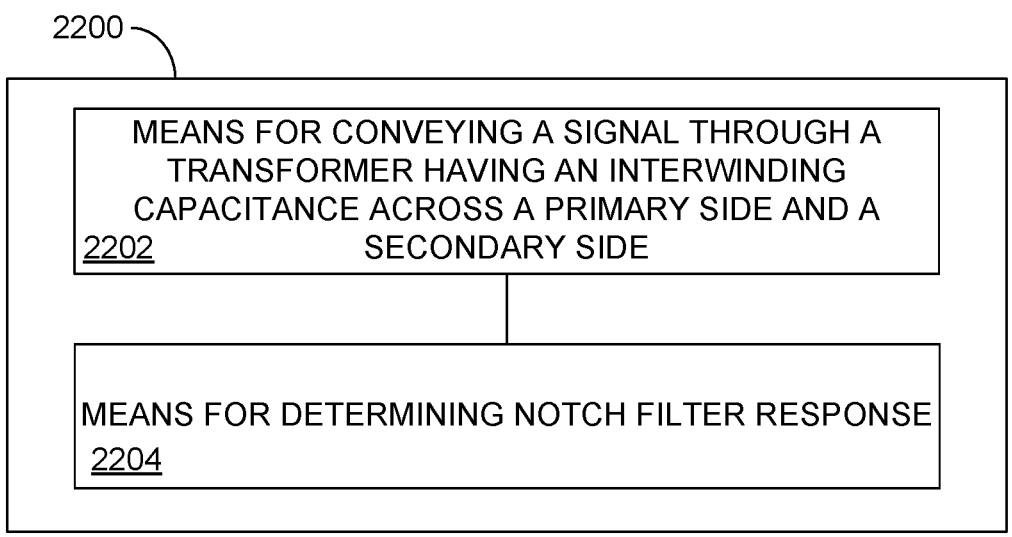
FIG. 22 is a functional block diagram of an apparatus for creating a notch filter response in accordance with an exemplary embodiment of the disclosure.

FIG. 22 is a functional block diagram of an apparatus 2200 for creating a notch filter response. The apparatus 2200 comprises means 2202 for conveying a signal through a transformer having an interwinding capacitance. In certain embodiments, the means 2202 for conveying a signal through a transformer having an interwinding capacitance can be configured to perform one or more of the functions described in operation block 2102 of method 2100 (FIG. 21). In an exemplary embodiment, the means 2202 for conveying a signal through a transformer having an interwinding capacitance may comprise the interwinding adjustable capacitance 520 between the input of the primary side 511 and the non-inverting output of the secondary side 512 of the transformer 510; or the interwinding adjustable capacitances 620 and 630 across respective positive and negative inputs of the primary side 611 and non-inverting and inverting outputs of the secondary side 612 of the transformer 610.

The apparatus 2200 also comprises means 2204 for determining a notch filter response. In certain embodiments, the means 2204 for determining a notch filter response can be configured to perform one or more of the functions described in operation block 2104 of method 2100 (FIG. 21). In an exemplary embodiment, the means 2204 for determining a notch filter response may comprise one or more elements configured to adjust the capacitance value of the interwinding adjustable capacitance 520 or the capacitance value of the interwinding adjustable capacitances 620 and 630 to determine a notch filter response at a desired frequency. For example, the means for determining may include the data processor 210 of FIG. 2A or FIG. 2B and/or elements such as switches or portions of the adjustable capacitances under control of the data processor 210.

Example embodiments are described in the following numbered clauses.

1. A filter circuit, comprising:
   a matching network having resistive and capacitive elements; and
   a transformer in the matching network, the transformer comprising a primary side and a secondary side, the transformer having at least one interwinding capacitance coupled from an input on the primary side to a non-inverting output on the secondary side.

2. The filter circuit of clause 1, wherein the filter circuit creates a notch response outside of a transmission band using an inductance provided only by an inductance of the transformer.

3. The filter circuit of any of clauses 1 through 2, wherein the filter circuit is single-ended.

4. The filter circuit of any of clauses 1 through 3, wherein the at least one interwinding capacitance has an adjustable capacitance configured to tune the frequency response of the filter circuit.

5. The filter circuit of any of clauses 1 through 4, wherein the larger the capacitance of the at least one interwinding capacitance, the lower a notch frequency of the filter circuit.

6. The filter circuit of any of clauses 1 through 5, wherein the filter circuit is differential and the transformer comprises an additional interwinding capacitance coupled between a negative input node (input−) on the primary side and a corresponding negative output node (inverting output) on the secondary side.

7. The filter circuit of any of clauses 1 through 6, wherein the notch response occurs at a millimeter wave (mmW) frequency.

8. The filter circuit of any of clauses 1 through 7, wherein the filter circuit creates an adjustable notch response at one of a lower frequency side and a higher frequency side of a transmission band.

9. The filter circuit of clause 8, wherein the adjustable notch response is selectable to determine a channel response of a transmit path configuring the transmit path to transmit a narrow bandwidth signal and a wide bandwidth signal in different communication slots in the same communication subframe.

10. The filter circuit of any of clauses 2 through 9, wherein the filter circuit comprises a plurality of matching networks coupled in series that implement a plurality of notch responses.

11. The filter circuit of any of clause 10, wherein the plurality of matching networks are implemented between different amplifiers coupled in series with each other and in series with the plurality of matching networks.

12. The filter circuit of any of clauses 1 through 11, wherein the filter circuit is coupled between a phase shifter and an antenna in a phased array.

13. A method for creating a notch filter response using a matching network with a tunable notch filter, comprising:
   conveying a signal through a transformer having an interwinding capacitance across an input of a primary side of a transformer and a non-inverting output of a secondary side of the transformer; and
   adjusting a value of the interwinding capacitance to determine a notch filter response.

14. The method of clause 13, wherein the filter creates a notch response outside of a transmission band using the interwinding capacitance and an inductance of the transformer.

15. The method of any of clauses 13 through 14, wherein the filter is single-ended.

16. The method of any of clauses 13 through 15, further comprising implementing the interwinding capacitance using an adjustable capacitance configured to tune the frequency response of the filter.

17. The method of any of clauses 13 through 16, wherein the larger the capacitance of the interwinding capacitance, the lower the notch frequency.

18. The method of any of clauses 13 through 17, wherein the notch filter response occurs at a millimeter wave (mmW) frequency.

19. The method of any of clauses 13 through 18, further comprising creating an adjustable notch response at one of a lower frequency side and a higher frequency side of a passband.

20. The method of clause 19, further comprising selecting the adjustable notch response to determine a channel response of a transmit path configuring the transmit path to transmit a narrow bandwidth signal and a wide bandwidth signal in different communication slots in the same communication subframe.

21. A device, comprising:
   means for conveying a signal through a transformer having an interwinding capacitance across an input of a primary side of a transformer and a non-inverting output of a secondary side of the transformer; and
   means for adjusting a value of the interwinding capacitance to determine a notch filter response.

22. The device of clause 21, further comprising means for creating a notch response outside of a transmission band using the interwinding capacitance and an inductance provided only by an inductance of the transformer.

23. The device of any of clauses 21 through 22, further comprising means for implementing the interwinding capacitance using an adjustable capacitance configured to tune the frequency response of the filter.

24. The device of any of clauses 21 through 23, wherein the larger the capacitance of the interwinding capacitance, the lower the notch frequency.

25. The device of any of clauses 21 through 24, further comprising means for creating an adjustable notch response at one of a lower frequency side and a higher frequency side of a passband.

26. The device of any of clauses 21 through 25, further comprising means for configuring the transmit path to transmit a narrow bandwidth signal and a wide bandwidth signal in different communication slots in the same communication subframe.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A filter circuit, comprising:
   a matching network having resistive and capacitive elements; and
   a transformer in the matching network, the transformer comprising a primary side and a secondary side, the transformer having at least one interwinding capacitance coupled from an input on the primary side to a non-inverting output on the secondary side,
   wherein the filter circuit is coupled between a phase shifter and an antenna in a phased array.

2. The filter circuit of claim 1, wherein the filter circuit creates a notch response outside of a transmission band using an inductance provided only by an inductance of the transformer.

3. The filter circuit of claim 2, wherein the notch response occurs at a millimeter wave (mmW) frequency.

4. The filter circuit of claim 2, wherein the filter circuit comprises a plurality of matching networks coupled in series that implement a plurality of notch responses.

5. The filter circuit of claim 4, wherein the plurality of matching networks are implemented between different amplifiers coupled in series with each other and in series with the plurality of matching networks.

6. The filter circuit of claim 1, wherein the filter circuit is single-ended.

7. The filter circuit of claim 1, wherein the at least one interwinding capacitance has an adjustable capacitance configured to tune a frequency response of the filter circuit.

8. The filter circuit of claim 7, wherein the larger the capacitance of the at least one interwinding capacitance, the lower a notch frequency of the filter circuit.

9. The filter circuit of claim 1, wherein the filter circuit is differential and the transformer comprises an additional interwinding capacitance coupled between a negative input node (input−) on the primary side and a corresponding negative output node (inverting output) on the secondary side.

10. The filter circuit of claim 1, wherein the filter circuit creates an adjustable notch response at one of a lower frequency side and a higher frequency side of a transmission band.

11. The filter circuit of claim 10, wherein the adjustable notch response is selectable to determine a channel response of a transmit path configuring the transmit path to transmit a narrow bandwidth signal and a wide bandwidth signal in different communication slots in the same communication subframe.

12. A method for creating a notch filter response using a matching network with a tunable notch filter, comprising:
    conveying a signal through a transformer having an interwinding capacitance across an input of a primary side of the transformer and a non-inverting output of a secondary side of the transformer;
    adjusting a value of the interwinding capacitance to determine the notch filter response;
    creating an adjustable notch response at one of a lower frequency side and a higher frequency side of a passband;
    selecting the adjustable notch response to determine a channel response of a transmit path; and
    configuring the transmit path to transmit a narrow bandwidth signal and a wide bandwidth signal in different communication slots in the same communication subframe.

13. The method of claim 12, wherein the filter creates the adjustable notch response outside of a transmission band using the interwinding capacitance and an inductance of the transformer.

14. The method of claim 13, wherein the notch filter response occurs at a millimeter wave (mmW) frequency.

15. The method of claim 12, wherein the filter is single-ended.

16. The method of claim 12, further comprising implementing the interwinding capacitance using an adjustable capacitance configured to tune a frequency response of the filter.

17. The method of claim 16, wherein the larger the capacitance of the interwinding capacitance, the lower a notch frequency.

18. A device, comprising:
    means for conveying a signal through a transformer having an interwinding capacitance across an input of a primary side of the transformer and a non-inverting output of a secondary side of the transformer;
    means for adjusting a value of the interwinding capacitance to determine a notch filter response;
    means for creating an adjustable notch response at one of a lower frequency side and a higher frequency side of a passband; and
    means for configuring the transmit path to transmit a narrow bandwidth signal and a wide bandwidth signal in different communication slots in the same communication subframe.

19. The device of claim 18, wherein the means for creating comprises means for creating the adjustable notch response outside of a transmission band using the interwinding capacitance and an inductance provided only by an inductance of the transformer.

20. The device of claim 18, further comprising means for implementing the interwinding capacitance using an adjustable capacitance configured to tune a frequency response of the filter.

21. The device of claim 20, wherein the larger the capacitance of the interwinding capacitance, the lower a notch frequency.

* * * * *